(12) United States Patent
Konishi et al.

(10) Patent No.: US 9,806,244 B2
(45) Date of Patent: Oct. 31, 2017

(54) SUBSTRATE FOR LIGHT EMITTING DEVICE, LIGHT EMITTING DEVICE, AND MANUFACTURING METHOD OF SUBSTRATE FOR LIGHT EMITTING DEVICE

(71) Applicant: Sharp Kabushiki Kaisha, Osaka-shi, Osaka (JP)

(72) Inventors: Masahiro Konishi, Osaka (JP); Shin Itoh, Osaka (JP); Hiroyuki Nokubo, Osaka (JP); Yoshiaki Itakura, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/101,969

(22) PCT Filed: Dec. 4, 2014

(86) PCT No.: PCT/JP2014/082158
§ 371 (c)(1),
(2) Date: Jun. 6, 2016

(87) PCT Pub. No.: WO2015/104928
PCT Pub. Date: Jul. 16, 2015

(65) Prior Publication Data
US 2016/0308101 A1    Oct. 20, 2016

(30) Foreign Application Priority Data

Jan. 10, 2014  (JP) ................................ 2014-003736
Apr. 23, 2014  (JP) ................................ 2014-089619

(51) Int. Cl.
*H01L 33/00*    (2010.01)
*H01L 33/62*    (2010.01)
(Continued)

(52) U.S. Cl.
CPC .......... *H01L 33/62* (2013.01); *H01L 21/4846* (2013.01); *H01L 33/54* (2013.01);
(Continued)

(58) Field of Classification Search
CPC ..... H01L 33/62; H01L 33/54; H01L 21/4846; H01L 33/60
(Continued)

(56) References Cited

U.S. PATENT DOCUMENTS

2006/0108601 A1* 5/2006 Okamoto .................. C23C 4/02
257/177
2009/0078455 A1* 3/2009 Takakusaki ............ H05K 1/056
174/260

(Continued)

FOREIGN PATENT DOCUMENTS

JP    59-149958 A    8/1984
JP    2000-174350 A    6/2000
(Continued)

OTHER PUBLICATIONS

Official Communication issued in International Patent Application No. PCT/JP2014/082158, dated Jan. 6, 2015.

*Primary Examiner* — David Vu
*Assistant Examiner* — Brandon Fox
(74) *Attorney, Agent, or Firm* — Keating & Bennett, LLP

(57) ABSTRACT

Provided is a substrate for a light emitting device having high reflectivity, high heat radiating properties, dielectric strength voltage properties, long-term reliability including heat resistance and light resistance, and excellent mass productivity. A substrate (20) for a light emitting device includes: a first insulating layer (11) having thermal conductivity which is formed on a surface of one side of a metal base (2); a wiring pattern (3) which is formed on the first insulating layer (11); and a second insulating layer (12)

(Continued)

having light reflectivity which is formed on the first insulating layer (11) and on some parts of the wiring pattern (3), so that some parts of the wiring pattern (3) are exposed, in which the first insulating layer (11) is a layer of ceramic formed by thermal spraying.

18 Claims, 17 Drawing Sheets

(51) Int. Cl.
| | | |
|---|---|---|
| *H01L 33/60* | (2010.01) | |
| *H01L 33/64* | (2010.01) | |
| *H05K 1/02* | (2006.01) | |
| *H05K 1/05* | (2006.01) | |
| *H01L 21/48* | (2006.01) | |
| *H01L 33/54* | (2010.01) | |
| H01L 25/075 | (2006.01) | |
| H05K 3/28 | (2006.01) | |

(52) U.S. Cl.
CPC ............ *H01L 33/60* (2013.01); *H01L 33/641* (2013.01); *H05K 1/0274* (2013.01); *H05K 1/053* (2013.01); *H01L 25/0753* (2013.01); *H01L 2224/16225* (2013.01); *H05K 3/285* (2013.01); *H05K 2201/10106* (2013.01); *H05K 2201/2054* (2013.01)

(58) Field of Classification Search
USPC .............................................. 257/79, 98, 99
See application file for complete search history.

(56) References Cited

U.S. PATENT DOCUMENTS

| | | | |
|---|---|---|---|
| 2010/0103680 A1* | 4/2010 | Oyaizu | ................... F21V 29/70 |
| | | | 362/294 |
| 2010/0214777 A1 | 8/2010 | Suehiro et al. | |
| 2011/0204409 A1* | 8/2011 | Sung | ..................... H05K 1/0373 |
| | | | 257/99 |
| 2012/0113650 A1 | 5/2012 | Inoue | |
| 2012/0325795 A1 | 12/2012 | Suzuki et al. | |
| 2013/0037842 A1* | 2/2013 | Yamada | ................. H01L 33/60 |
| | | | 257/98 |
| 2014/0021851 A1* | 1/2014 | Heo | ....................... H05B 33/02 |
| | | | 313/113 |
| 2014/0239331 A1* | 8/2014 | Oyu | ..................... H05K 13/046 |
| | | | 257/98 |
| 2014/0327024 A1 | 11/2014 | Ishihara et al. | |
| 2015/0155459 A1 | 6/2015 | Ishihara et al. | |

FOREIGN PATENT DOCUMENTS

| | | | |
|---|---|---|---|
| JP | 2006-332382 A | 12/2006 | |
| JP | 2007-317701 A | 12/2007 | |
| JP | 2010-199203 A | 9/2010 | |
| JP | 2010-287753 A | 12/2010 | |
| JP | 2011-187752 A | 9/2011 | |
| JP | 2012-069749 A | 4/2012 | |
| JP | 2012-102007 A | 5/2012 | |
| JP | 2012-243846 A | 12/2012 | |
| JP | 2014-003176 A | 1/2014 | |
| KR | 20140018771 A | * 2/2014 | .......... H01L 33/644 |
| WO | 2013/183693 A1 | 12/2013 | |

* cited by examiner

1: LIGHT EMITTING DEVICE
2: METAL BASE
3: WIRING PATTERN
4: LED CHIP
5: LIGHT-REFLECTING RESIN FRAME
6: PHOSPHOR-CONTAINING SEALING RESIN
7: ANODE ELECTRODE
8: CATHODE ELECTRODE
9: ANODE MARK
10: CATHODE MARK

2: METAL BASE
3: WIRING PATTERN
4: LED CHIP
11: FIRST INSULATING LAYER
12: SECOND INSULATING LAYER HAVING LIGHT REFLECTIVITY
20: SUBSTRATE FOR LIGHT EMITTING DEVICE

2: METAL BASE
3: WIRING PATTERN
4: LED CHIP
11: FIRST INSULATING LAYER
12: SECOND INSULATING LAYER HAVING LIGHT REFLECTIVITY
16: ADHESION LAYER
20a: SUBSTRATE FOR LIGHT EMITTING DEVICE

2: METAL BASE
3': WIRING PATTERN (COPPER PASTE)
4: LED CHIP
11: FIRST INSULATING LAYER
12: SECOND INSULATING LAYER HAVING LIGHT REFLECTIVITY
20': SUBSTRATE FOR LIGHT EMITTING DEVICE
21: SMOOTHENING LAYER (ALUMINA-CONTAINING GLASS LAYER)

2: METAL BASE
3: WIRING PATTERN
4: LED CHIP
11: FIRST INSULATING LAYER
12: SECOND INSULATING LAYER HAVING LIGHT REFLECTIVITY
20: SUBSTRATE FOR LIGHT EMITTING DEVICE
250: BUFFER LAYER

2: METAL BASE
3: WIRING PATTERN (COPPER PASTE)
4: LED CHIP
11: FIRST INSULATING LAYER
12: SECOND INSULATING LAYER HAVING LIGHT REFLECTIVITY
20': SUBSTRATE FOR LIGHT EMITTING DEVICE
21: SMOOTHENING LAYER (ALUMINA-CONTAINING GLASS LAYER)
250: BUFFER LAYER

SUBSTRATE FOR LIGHT EMITTING DEVICE, LIGHT EMITTING DEVICE, AND MANUFACTURING METHOD OF SUBSTRATE FOR LIGHT EMITTING DEVICE

TECHNICAL FIELD

The present invention relates to a substrate for a light emitting device, a light emitting device using the substrate for a light emitting device, and a manufacturing method of the substrate for a light emitting device. The present invention particularly relates to a substrate for a light emitting device having high dielectric strength voltage properties and heat radiating properties.

BACKGROUND ART

High reflectivity, high heat radiating properties, dielectric strength voltage, and long-term reliability can be exemplified as basic properties necessary for a substrate for a light emitting device. High dielectric strength voltage properties are particularly necessary for a substrate for a light emitting device used in high-intensity lighting.

In the related art, a light emitting device including a ceramic substrate or a substrate including an organic resist layer on a metal base as an insulating layer has been known as a substrate for a light emitting device. Hereinafter, respective problems of a ceramic substrate and a substrate using a metal base will be described.

(Ceramic Substrate)

For example, a ceramic substrate is manufactured by forming an electrode pattern on a plate-like ceramic substrate. The brightness is required to be improved by arranging a plurality of light emitting elements, in accordance with a tendency of realizing high output of a light emitting device, and therefore, ceramic substrates have been increasing in size every year.

Specifically, in a case of realizing a typical LED light emitting device using supplied power of 30 W by arranging, for example, face-up type (an active layer is positioned to be far from a mounting surface) blue LED elements having a dimension of 650 μm×650 μm or approximately the dimension thereof in one substrate classified as a medium-size substrate, approximately 100 LED elements are necessary. As a ceramic substrate in which approximately 100 LED elements are arranged, a ceramic substrate having a horizontal size of 20 mm×20 mm or larger and a thickness of approximately 1 mm is used, for example.

In a case where it is attempted to realize a light emitting device for brighter LED lighting using supplied power of 100 W or higher, a large-sized ceramic substrate having at least a horizontal size of 40 mm×40 mm which can mount 400 or more LED elements at once is necessary, as a result of technological development based on an increase in size of a substrate.

However, increasing a size of a ceramic substrate has been attempted in order to realize a larger size on a commercial basis in accordance with the requirements of an increase in size of a ceramic substrate, but a larger size thereof is difficult to realize on a commercial basis due to three problems of strength, manufacturing precision, and manufacturing cost of a substrate.

Since a ceramic material is normally a piece of pottery, a problem regarding strength of a substrate occurs, when a size thereof is increased. When a thickness of a substrate is increased in order to solve this problem, new problems occur such that heat resistance increases (heat radiating properties are deteriorated) and a material cost of a substrate also increases. When a size of a ceramic substrate is increased, not only external dimensions of a substrate, but dimensions of a conductor pattern formed on a substrate are also likely changed, and this may easily result in a decrease in manufacturing yield and an increase in manufacturing cost of a substrate.

An increase in the number of light emitting elements to be mounted is also a problem along with the problems associated with an increase in size of a substrate. For example, in the light emitting device described above, the number of light emitting elements mounted on one substrate is extremely large, as much as 400 or more, and this is a reason for a decrease in manufacturing yield.

In addition, in a face-up type light emitting element, an active layer is positioned on a side far from a light emitting element mounting surface of a substrate for a light emitting device, and accordingly, heat resistance up to a portion of an active layer is high and an active layer temperature easily increases. In a high-output light emitting device having the large number of light emitting elements to be accumulated on one substrate, a substrate temperature which is a basic condition is high, an active layer temperature of a light emitting element is higher than the substrate temperature, and a decrease in lifetime of a light emitting element becomes significant.

(Substrate Using Metal Base)

Meanwhile, a metal base having thermal conductivity may be used as a substrate for a high-output light emitting device, in order to solve the problems in a ceramic substrate. Herein, an insulating layer is provided on a metal base, in order to mount light emitting elements on a metal base and in order to form an electrode pattern.

In a substrate for a light emitting device, an organic resist is used as an insulating layer, in the related art.

In addition, it is necessary that the insulating layer has high light reflectivity, in order to improve light use efficiency in a substrate for a high-output light emitting device.

However, in a case of using an organic resist as an insulating layer in a substrate for a light emitting device in the related art, sufficient thermal conductivity, heat resistance, and light resistance are not obtained and dielectric strength voltage properties necessary for a substrate for a high-output light emitting device are not obtained. It is necessary that light leaked to a metal base side through an insulating layer is reflected, in order to improve light use efficiency, but sufficient light reflectivity is not obtained in a configuration in which an organic resist of the related art is used as an insulating layer.

Therefore, a substrate in which an insulator layer is formed on a substrate using a metal base, by using a ceramic coating material has been proposed.

It is possible to realize a substrate for a light emitting device having excellent reflectivity, heat resistance, and light resistance, in a substrate for a light emitting device in which a light reflecting layer which also serves as an insulator layer is formed on a metal base surface by using a ceramic coating material.

PTL 5 below discloses a technology of forming an insulating layer formed of ceramic such as alumina on a metal base which is a base by plasma spraying, without using a coating material, and manufacturing a substrate for a light source, for example. In a substrate for a light source in which an alumina insulating layer is formed by plasma spraying as described above, it is possible to realize a substrate for a light source having excellent electrical dielectric strength voltage properties.

CITATION LIST

Patent Literature

PTL 1: Japanese Unexamined Patent Application Publication No. 59-149958 (published in Aug. 28, 1984)
PTL 2: Japanese Unexamined Patent Application Publication No. 2012-102007 (published in May 31, 2012)
PTL 3: Japanese Unexamined Patent Application Publication No. 2012-69749 (published in Apr. 5, 2012)
PTL 4: Japanese Unexamined Patent Application Publication No. 2006-332382 (published in Dec. 7, 2006)
PTL 5: Japanese Unexamined Patent Application Publication No. 2007-317701 (published in Dec. 6, 2007)

SUMMARY OF INVENTION

Technical Problem

However, in a case of a substrate for a light emitting device in which a light reflecting layer which also serves as an insulator layer is formed on a metal base substrate surface using a ceramic coating material, excellent reflectivity and heat radiating properties are obtained, but dielectric strength voltage properties are low. For example, in a case where it is attempted to realize a light emitting device for bright LED lighting using supplied power of 100 W or higher by using the substrate described above, it is difficult to ensure high dielectric strength voltage properties necessary for a substrate for a light emitting device for the purpose of high-intensity lighting, unlike the case of the ceramic substrate.

This is due to the reason described below. In a high-intensity type lighting requiring brightness, light emitting elements are generally connected to each other in series and light emitting is performed at a high voltage. From viewpoints of short circuit prevention and safety, the entire apparatus needs to have dielectric strength voltage properties of 4 kV to 5 kV or higher, for example, in such a lighting device, and a substrate for a light emitting device also needs to have the equivalent dielectric strength voltage properties.

In a ceramic substrate having problems such as a decrease in manufacturing yield and an increase in manufacturing cost of a substrate, a thickness of an insulating layer is increased and a level of dielectric strength voltage properties corresponding thereto are easily obtained. With respect to this, in a case of a substrate for a light emitting device in which a light reflecting layer which also serves as an insulator layer is formed on a metal base surface by using a ceramic coating material, it is difficult to form the insulating layer and stably realize insulating properties. When the desired high dielectric strength voltage properties are stably ensured by increasing a thickness of the light reflecting layer which also serves as an insulator layer, heat resistance increases and heat radiating properties decrease.

A substrate for a light source in which an alumina insulating layer is formed by plasma spraying disclosed in PTL 5 is a substrate for a light source having excellent electrical dielectric strength voltage properties and excellent heat radiating properties. However, even when the most preferable alumina film is obtained by plasma spraying, reflectivity thereof is at most approximately 82% to 85% and a highly reflective substrate is difficult to be realized. Accordingly, the substrate for a light source manufactured by a method disclosed in PTL 5 is not suitable as a substrate for a light emitting device which is used in a high-intensity lighting field in which 90% or more or 95% or more of reflectivity is usually required.

A surface of the alumina insulating layer formed by plasma spraying is a convex and concave surface, and accordingly, in a case where face-up type light emitting elements are mounted on the alumina insulating layer formed by plasma spraying, thermal contact between the light emitting elements and the alumina layer is limited to point contact between a lower surface of the light emitting elements and protruded portions of the alumina layer and heat resistance significantly increases. As described above, in the face-up type light emitting element, the active layer is positioned on a side far from the light emitting element mounting surface of the substrate for a light emitting device, and accordingly, an active layer temperature easily increases. When high heat resistance is imparted between the light emitting element and the alumina layer as described above, a temperature increases to be substantially proportional to power supplied to the light emitting element. Therefore, in a high-output light emitting device having high power supplied to one light emitting element, an active layer temperature of the light emitting element rapidly increases and the lifetime of the light emitting element decreases. As described above, the substrate for a light source in which the alumina insulating layer is formed on the metal base by plasma spraying has deteriorated heat radiating properties.

Since the surface of the alumina insulating layer formed by plasma spraying is a convex and concave surface, metal electrodes are hardly formed. For example, in a case where a base circuit pattern is formed by printing metal paste and is coated by plating, so that electrodes are formed on a ceramic flat plate, defects are generated in printing of paste on a convex and concave surface. Scratches are easily generated in the paste printing and this becomes a reason for defects formed during plating. Since a boundary of a printed portion is not clearly shown due to the influence on a convex and concave surface, the finish of plating does not become uniform.

As described above, in the substrate for a light emitting device using a metal as a base in the related art, a substrate having low heat resistance, excellent heat radiating properties, reflectivity, and dielectric strength voltage properties is not suitable at least for mass production.

The present invention has been made to address the aforementioned problems and provide a substrate for a light emitting device having high reflectivity, high heat radiating properties, dielectric strength voltage properties, long-term reliability containing heat resistance and light resistance, and excellent mass productivity, a light emitting device using the substrate for a light emitting device, and a manufacturing method of the substrate for a light emitting device.

Solution to Problem

In order to solve the above-mentioned problems, according to an aspect of the invention, there is provided a substrate for a light emitting device including a base formed of a metal material, the substrate including: a first insulating layer having thermal conductivity which is formed on a surface of one side of the base; a wiring pattern which is formed on the first insulating layer; and a second insulating layer having light reflectivity which is formed on the first insulating layer and on some parts of the wiring pattern, so that some parts of the wiring pattern are exposed, in which the first insulating layer is a layer of ceramic formed by thermal spraying.

In order to solve the above-mentioned problems, according to an aspect of the invention, there is provided a manufacturing method of a substrate for a light emitting device including a base formed of a metal material, the method including: a first step of forming a first insulating layer having thermal conductivity on a surface of one side of the base and forming a conductive layer on the first insulating layer; and a second step of forming a second insulating layer having light reflectivity on the first insulating layer and on some parts of the conductive layer, so that some parts of the conductive layer are exposed, in which the first insulating layer of ceramic is formed by thermal spraying in the first step.

In a typical substrate for a light emitting device using a metal base as a base in the related art, it is necessary that sintering is performed at a temperature lower than a melting point of the metal base and an insulator layer is formed on the metal base. Accordingly, it is difficult to obtain a dense high-quality insulator layer by using materials except a special high-melting-point metal such as molybdenum, tantalum, or tungsten, and thus, an insulator layer having a comparatively great thickness is formed on the metal base, in order to ensure desired dielectric strength voltage properties. In a case where face-up type light emitting elements are mounted on such a substrate for a light emitting device, heat leaks in the order of the light emitting elements, the insulator layer having a comparatively great thickness, the metal base, and a heat sink for heat radiating including the substrate for a light emitting device mounted thereon, and thus, heat radiating properties are deteriorated due to disturbance of the insulator layer having a comparatively great thickness.

In a case where a conductor pattern for mounting a light emitting element is formed on the substrate for a light emitting device and an electrode pad of a flip-chip type light emitting element is directly bonded to an electrode terminal, heat leaks in the order of the light emitting elements, the electrode of the light emitting element, the wiring pattern, the insulator layer having a comparatively great thickness, and the metal base, and thus, heat radiating properties are deteriorated due to disturbance of the insulator layer having a comparatively great thickness.

The wiring pattern formed on the insulator layer is normally formed with metal paste for an electrode base and a plating layer. In a case of a flip-chip type light emitting element used by mounting the light emitting element on a conductor pattern, the electrode pattern is not simply a path for supplying power, but a main heat radiating path, as described above. Thermal conductivity of the metal paste for an electrode base is generally low and this becomes a reason for an increase in heat resistance.

When a flip-chip type light emitting element is used in the substrate for a light emitting device using a metal base as a base in the related art, the lifetime of the light emitting element may decrease due to a difference in coefficient of linear expansion between the metal base and the light emitting element. In order to prevent this problem, a metal having a small coefficient of linear expansion, for example, an expensive metal such as molybdenum can only be used as the metal base.

In order to manufacture a substrate for a light emitting device using a typical metal base as a base, except for a special high-melting-point metal such as molybdenum, tantalum, or tungsten, it is necessary that a high-quality insulating layer satisfying both of ensuring of electrical insulating properties and a decrease in heat resistance is formed on the metal base at a temperature which is sufficiently lower than a melting point of the metal base, but in the substrate for a light emitting device of the related art, it was difficult to satisfy the above-mentioned requirements and to ensure mass productivity.

Meanwhile, in the substrate for a light emitting device and the manufacturing method of the substrate for a light emitting device of the invention, the first insulating layer of ceramic is formed by thermal spraying on a surface of one side of the base formed of a metal material. The first insulating layer formed by ceramic thermal spraying has insulating properties and thermal conductivity which are equivalent to those of an insulating layer of ceramic formed by sintering. The first insulating layer formed by ceramic thermal spraying is a dense high-quality ceramic layer, and accordingly, desired dielectric strength voltage properties can be realized with a comparatively small layer thickness.

Accordingly, in the substrate for a light emitting device of the invention, it is possible to further decrease heat resistance of the substrate and ensure excellent heat radiating properties necessary for a substrate for a high-intensity light emitting device, from a thin thickness of the first insulating layer and thermal conductivity of the first insulating layer formed by thermal spraying.

By forming a wiring pattern on the first insulating layer, it is possible to realize excellent heat radiating properties without interposing a high-resistivity layer having low thermal conductivity between the first insulating layer and the wiring pattern.

In addition, in the substrate for a light emitting device and the manufacturing method of the substrate for a light emitting device of the invention, regarding the problem of a decrease of the lifetime of the light emitting element due to a difference in coefficient of linear expansion between the metal base and the light emitting element, the first insulating layer of dense high-quality ceramic formed by thermal spraying is interposed between the light emitting element and the metal base as an intermediate layer, so that the first insulating layer as the intermediate layer having a coefficient of linear expansion similar to that of the light emitting element formed of a sapphire substrate is operated as a buffer layer, and therefore, it is possible to prevent a decrease in the lifetime of the light emitting element caused by expansion and contraction of the metal base. In addition, a range of selection of kinds of the metal base is widened.

In the substrate for a light emitting device and the manufacturing method of the substrate for a light emitting device of the invention, since the first insulating layer is formed by ceramic thermal spraying, the dense first high-quality insulating layer can be formed even on a base formed of a metal material having a melting point lower than a sintering temperature of ceramic. Therefore, it is possible to realize a substrate for a light emitting device having excellent mass productivity and a manufacturing method of the substrate for a light emitting device.

In the substrate for a light emitting device and the manufacturing method of the substrate for a light emitting device of the invention, since the second insulating layer having light reflectivity which is formed on the first insulating layer and on some parts of the wiring pattern, is formed so that some parts of the wiring pattern are exposed, it is possible to realize a substrate for a light emitting device having high reflectivity and a manufacturing method of the substrate for a light emitting device.

In the substrate for a light emitting device and the manufacturing method of the substrate for a light emitting device of the invention, since the first insulating layer is a layer formed of ceramic, it is possible to realize a substrate for a light emitting device having long-term reliability containing heat resistance and light resistance.

As described above, according to this configuration of the invention, it is possible to realize a substrate for a light emitting device having high reflectivity, high heat radiating properties, dielectric strength voltage properties, long-term reliability with heat resistance and light resistance, and excellent mass productivity, and a manufacturing method of the substrate for a light emitting device.

In order to solve the above-mentioned problems, according to still another aspect of the invention, there is provided a light emitting device including: a light emitting element which is electrically connected to a terminal portion of the wiring pattern exposed from the second insulating layer of the substrate for a light emitting device, in which the wiring pattern is connected to an external wiring or an external device, and a frame portion formed of a resin having light reflectivity which is formed so as to surround a region in which the light emitting element of the substrate for a light emitting device is disposed, and a sealing resin which seals the region surrounded by the frame portion are formed.

Since the light emitting device of the invention includes a substrate for a light emitting device having high reflectivity, high heat radiating properties, dielectric strength voltage properties, long-term reliability with heat resistance and light resistance, and excellent mass productivity, it is possible to realize a light emitting device having high reflectivity, high heat radiating properties, dielectric strength voltage properties, long-term reliability with heat resistance and light resistance, and excellent mass productivity.

Advantageous Effects of Invention

According to the substrate for a light emitting device, the light emitting device using the substrate for a light emitting device, and the manufacturing method of the substrate for a light emitting device of the invention, it is possible to provide a substrate for a light emitting device having high reflectivity, high heat radiating properties, dielectric strength voltage properties, long-term reliability, and excellent mass productivity, a light emitting device using the substrate for a light emitting device, and a manufacturing method of the substrate for a light emitting device.

DESCRIPTION OF EMBODIMENTS

Hereinafter, embodiments of the invention will be described in detail with reference to the drawings. Herein, dimensions, materials, shapes, and relative positioning of constituent elements disclosed in the embodiments are merely one embodiment and a scope of the invention is not limited thereto.

The embodiments of the invention will be described as follows with reference to FIG. 1 to FIG. 9.

Embodiment 1

One embodiment of the invention will be described as follows with reference to FIG. 1 to FIG. 4.

(Light Emitting Device)

Figure 1:
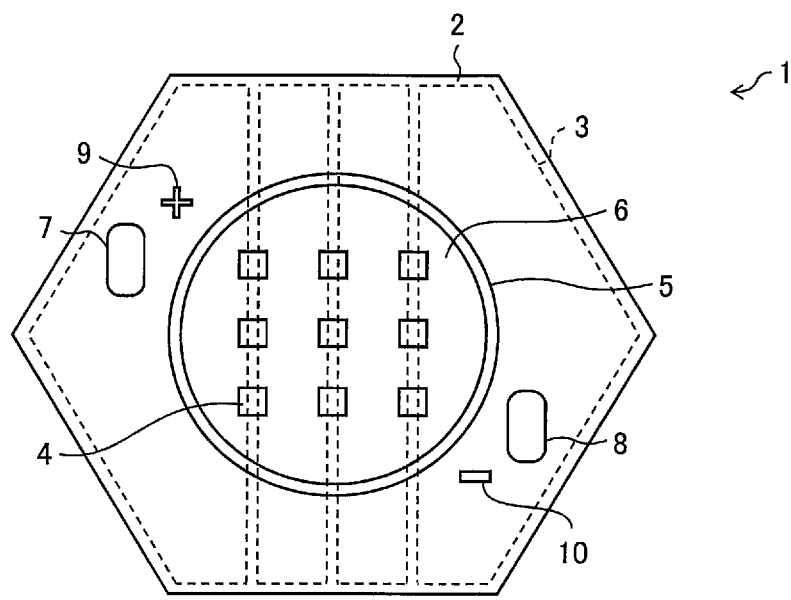
FIG. 1 is a plan view showing a schematic configuration of a light emitting device 1.

FIG. 1 is a plan view showing a schematic configuration of a light emitting device 1 of the embodiment.

Figure 2:
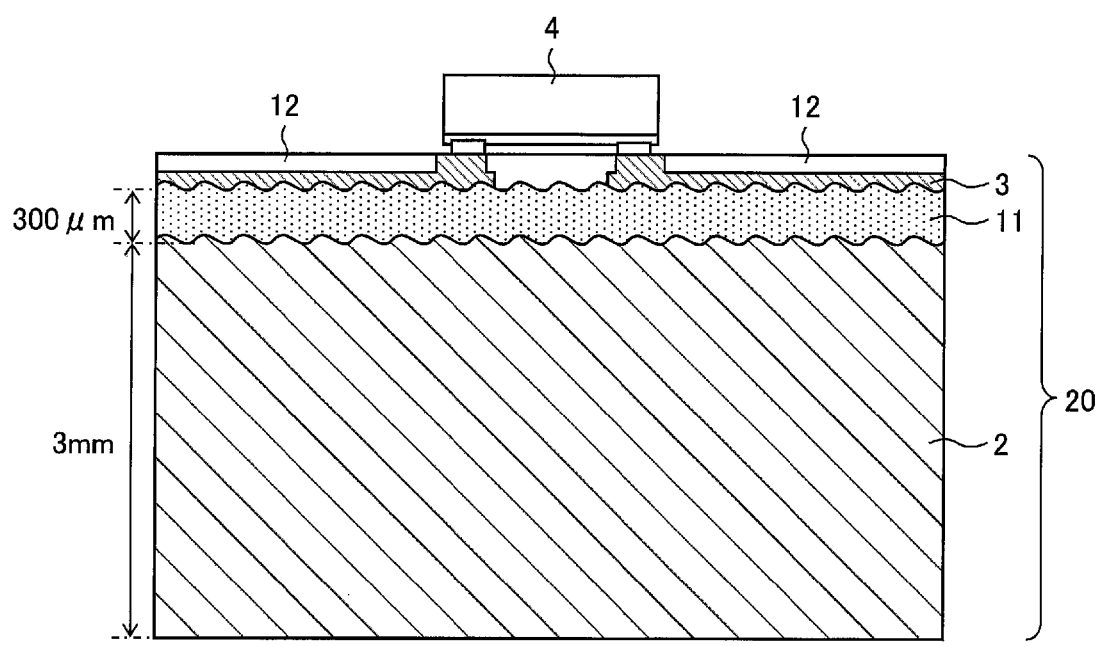
FIG. 2 is a sectional view showing a schematic configuration of a substrate 20 for a light emitting device included in the light emitting device 1 shown in FIG. 1.

FIG. 2 is a sectional view showing a schematic configuration of a substrate 20 for a light emitting device included in the light emitting device 1 shown in FIG. 1.

As shown in FIG. 1 and FIG. 2, the light emitting device 1 includes a metal base 2, a first insulating layer 11 (shown in FIG. 2), a wiring pattern 3, a second insulating layer 12 (shown in FIG. 2), and LED chips 4.

The LED chips 4 (light emitting elements) are electrically connected to the wiring pattern 3 and nine LED chips 4 arranged in three columns and three rows are shown in FIG. 1. The nine LED chips 4 have a connection configuration in which the LED chips are connected in parallel in three columns using the wiring pattern 3 and series circuits of three LED chips 4 is provided to each LED chip in the three columns (that is, three series • three parallel). The number of the LED chips 4 is not limited to nine and the LED chips may not have a connection configuration of three series • three parallel.

The light emitting device 1 further includes a light-reflecting resin frame 5, a phosphor-containing sealing resin 6, an anode electrode (anode land) 7, a cathode electrode (cathode land) 8, an anode mark 9, and a cathode mark 10.

The light-reflecting resin frame 5 is a disc-shaped (arc) frame formed of alumina filler-containing silicone resin which is provided on the wiring pattern 3 and the second insulating layer 12. The material of the light-reflecting resin frame 5 is not limited thereto and may be an insulating resin having light reflectivity. The shape thereof is not limited to a disc (arc) shape, either, and an arbitrary shape can be used.

The phosphor-containing sealing resin 6 is a sealing resin layer formed of a transparent resin. A region surrounded by the light-reflecting resin frame 5 is filled with the phosphor-containing sealing resin 6 and the phosphor-containing sealing resin seals the wiring pattern 3, the LED chips 4, and the second insulating layer 12. The phosphor-containing sealing resin 6 contains a phosphor. As the phosphor, a phosphor which is excited by primary light emitted from the LED chips 4 and emits light at a wavelength longer than that of the primary light is used.

The configuration of the phosphor is not particularly limited and can be suitably selected according to desired white color and the like. For example, as a combination of neutral white and light bulb color, a combination of a YAG yellow phosphor and (Sr, Ca) $AlSiN_3$:Eu red phosphor, or a combination of a YAG yellow phosphor and $CaAlSiN_3$:Eu red phosphor can be used. As a combination of high color rendering, a combination of a (Sr, Ca) $AlSiN_3$:Eu red phosphor and a $Ca_3 (Sc, Mg)_2Si_3O_{12}$:Ce insulating phosphor or a $Lu_3Al_5O_{12}$:Ce insulating phosphor can be used. A combination of other phosphors may be used and a configuration of containing only a YAG yellow phosphor as false white.

The anode electrode (anode land) 7 and the cathode electrode (cathode land) 8 are electrodes supplying a current for driving the LED chips 4 to the LED chips 4 and are provided in a state of a land. The anode electrode (anode land) 7 and the cathode electrode (cathode land) 8 are electrodes capable of being connected to an external power supply (not shown) of the light emitting device 1. The anode electrode (anode land) 7 and the cathode electrode (cathode land) 8 are connected to the LED chips 4 through the wiring pattern 3.

The anode mark 9 and the cathode mark 10 are respectively alignment marks which are references for performing positioning with respect to the anode electrode (anode land) 7 and the cathode electrode (cathode land) 8. The anode mark 9 and the cathode mark 10 respectively have functions of indicating the anode electrode (anode land) 7 and the cathode electrode (cathode land) 8.

A thickness of a portion of the wiring pattern 3 immediately below the anode electrode (anode land) 7 and the cathode electrode (cathode land) 8 is greater than a thickness of a portion of the wiring pattern 3 other than the portion immediately below the electrodes.

Specifically, the thickness of the wiring pattern 3 immediately below the anode electrode (anode land) 7 and the cathode electrode (cathode land) 8 is preferably from 70 μm to 300 μm and the thickness thereof in a portion other than the portion immediately below the electrodes is preferably from 35 μm to 250 μm. A heat radiating function of the light emitting device 1 is improved in a case of a great thickness of the wiring pattern 3. However, even in a case where the thickness of the wiring pattern 3 is increased to be more than the range described above by allowing the thickness of the wiring pattern 3 to exceed 300 μm, heat resistance decreases and heat radiating properties are also improved, as long as the LED chips 4 are arranged at sufficient intervals. For example, when the intervals between the LED chips 4 are set as 600 μm or more which is double or more of the 300 μm which is the thickness of the wiring pattern 3, it is possible to decrease heat resistance. When intervals between the light emitting elements are sufficiently provided as described above, heat radiating properties are improved, but the number of light emitting elements mounted on the substrate for a light emitting device decreases. The thickness of the wiring pattern 3 immediately below the anode electrode (anode land) 7 and the cathode electrode (cathode land) 8 is set as 300 μm and the thickness thereof in a portion other than the portion immediately below the electrodes is set as 250 μm, as a measure of the practical limit, and there is no limitation for the purpose or use.

The total of a base area of the wiring pattern 3 is preferably at least four times or more of the total area of electrode terminals for mounting the LED chips 4 in the wiring pattern 3. When the thermal conductivity of the first insulating layer 11 shown in FIG. 2 is lower than the thermal conductivity of the wiring pattern 3 and the wiring pattern 3 occupies sufficiently a wide area of a portion coming into contact with the first insulating layer 11, it is possible to decrease heat resistance applied to heat passing through the first insulating layer 11. A proportion of the area described above is set to be four times or more, when it is assumed that the thermal conductivity of the first insulating layer 11 is 15 W/(m·° C.), but in a case where the thermal conductivity thereof is lower than this, for example, 7.5 W/(m·° C.), the proportion of the area described above is desirably set to be eight times or more. As the thermal conductivity decreases, it is desired to have great total of the base area of the wiring pattern as much as possible.

(Substrate for Light Emitting Device)

Hereinafter, each layer included in the substrate 20 for a light emitting device will be described with reference to FIG. 2.

As shown in FIG. 2, the substrate 20 for a light emitting device includes the base 2 formed of a metal material, the first insulating layer 11 having thermal conductivity which is formed on a surface of one side of the base 2, the wiring pattern 3 which is formed on the first insulating layer 11, and the second insulating layer 12 having light reflectivity which is formed on the first insulating layer 11 and on some parts of the wiring pattern 3, so that some parts of the wiring pattern 3 are exposed.

(Base Formed of Metal Material)

In the embodiment, an aluminum base was used as the base 2 formed of a metal material. As an aluminum base, an aluminum plate having a size of 50 mm (length)×50 mm (width)×3 mm (thickness) can be used, for example. The advantages of aluminum are light weight, excellent workability, and high thermal conductivity. In addition, components other than aluminum may be contained in the aluminum base in a range not disturbing anodic oxidation. As mentioned below specifically, in the embodiment, the first insulating layer 11, the wiring pattern 3, and the second insulating layer 12 having light reflectivity can be formed on the base 2 at a comparatively low temperature, and accordingly, an aluminum base formed of low-melting-point metal having a melting point of 660° C. can be used as the base 2 formed of a metal material. Therefore, there is no limitation to the aluminum base and various materials can be selected as the base 2 formed of a metal material such as a copper base, for example.

(First Insulating Layer Having Thermal Conductivity)

In the embodiment, as shown in FIG. 2, the first insulating layer 11 which is a ceramic insulator having thermal conductivity is formed between the base 2 formed of a metal material and the wiring pattern 3 or the second insulating layer 12 having light reflectivity, in order to stably impart high heat radiating properties and high dielectric strength voltage properties to the substrate 20 for a light emitting device.

The first insulating layer 11 is an insulating layer having excellent thermal conductivity which is formed on the base 2 formed of a metal material by thermal spraying. A binder such as glass or a resin decreasing thermal conductivity is not used in the first insulating layer 11, and accordingly, the high level of the thermal conductivity of original ceramic is not deteriorated. Therefore, it is possible to realize the same dielectric strength voltage properties with low heat resistance, compared to an insulating layer formed using the binder.

As described above, in the embodiment, since an aluminum base formed of low-melting-point metal having a melting point of 660° C. is used as the base 2 formed of a metal material, the first insulating layer 11 cannot be formed by directly sintering a ceramic sintered body on the aluminum base, but the first insulating layer 11 can be formed on the aluminum base by using thermal spraying.

That is, for example, when a method welding such as high velocity flame spraying or plasma spraying is used, the first insulating layer formed of only ceramic can be easily formed without using a binder formed of glass or a resin.

As described above, since the good first insulating layer 11 having high heat radiating properties and high dielectric strength properties can be formed on the substrate 20 for a light emitting device, it is possible to stably impart high heat radiating properties and high dielectric strength voltage properties to the substrate 20 for a light emitting device.

As ceramic used for forming the first insulating layer 11, alumina is desirable due to high insulating properties and thermal conductivity and good balance therebetween, and thus, alumina is used in the embodiment, but there is no limitation. In addition to alumina, aluminum nitride or silicon nitride is preferable because aluminum nitride or silicon nitride has excellent thermal conductivity and dielectric strength voltage properties.

In addition, silicon carbide has high thermal conductivity and zirconia and titanium oxide has high dielectric strength voltage properties. Accordingly, various metals are preferably suitably used according to the purpose or use of the first insulating layer 11.

Ceramic herein is not limited to a metal oxide and is ceramic in a broad sense containing aluminum nitride, silicon nitride, or silicon carbide, that is, contains all of inorganic solid materials. Among these inorganic solid materials, the ceramic may be any arbitrary material, as long as it is a stable material having excellent heat resistance and thermal conductivity and a material having excellent dielectric strength voltage properties.

It is desired that the first insulating layer 11 has higher thermal conductivity than that of ceramic particles which can be used in the second insulating layer 12 which will be specifically described later.

In the embodiment, an insulating layer formed of alumina having higher thermal conductivity than that of zirconia is used as the first insulating layer 11, and this is because an insulating layer containing zirconia particles is used as the second insulating layer 12 in the embodiment. In order to form an electrical insulating layer by thermal spraying, it is general to form an insulating layer of alumina formed by performing thermal spraying of alumina, and the insulating layer formed of alumina described above is also preferable due to excellent thermal conductivity and dielectric strength voltage properties.

Both of the first insulating layer 11 and the second insulating layer 12 which will be described later are insulating layers, but the second insulating layer 12 having light reflectivity is good enough as long as it has a minimum thickness necessary for ensuring a light reflecting function. The light reflectivity of the second insulating layer 12 is dependent on a ceramic material to be mixed and the amount thereof, but reflectivity thereof is substantially saturated when a layer thickness is 10 μm to 100 μm. The dielectric strength voltage properties of the first insulating layer 11 are dependent on formation conditions of the insulating layer, but the first insulating layer 11 is preferably formed to have a layer thickness of 50 μm to 500 μm. The dielectric strength voltage properties of the first insulating layer 11 formed by thermal spraying are approximately 15 kV/mm to 30 kV/mm, and accordingly, when the first insulating layer 11 is formed to have a thickness of 100 μm, for example, it is possible to ensure at least dielectric strength voltage properties of 1.5 kV to 3 kV or more with only the first insulating layer 11, and when the first insulating layer 11 is formed to have a thickness of 500 μm, it is possible to ensure at least dielectric strength voltage properties of 7.5 kV to 15 kV with only the first insulating layer 11.

Herein, since the wiring pattern 3 is directly formed on the first insulating layer 11, it is necessary to design the layer thickness of the first insulating layer 11 so that the dielectric strength voltage properties between the base 2 and the wiring pattern 3 are approximately 4 kV to 5 kV. It is possible to realize dielectric strength voltage properties of 4.5 kV, when the thickness thereof is at least 300 μm.

The thermal conductivity of a ceramic layer formed by using the thermal spraying is similar to thermal conductivity of a ceramic layer formed by sintering and is, of example, a value of 10 W/(m·° C.) to 30 W/(m·° C.). However, an insulating layer formed by solidifying ceramic particles using a binder formed of glass or a resin receives an influence of low thermal conductivity of glass or a resin, and thus, thermal conductivity thereof is normally approximately 1 W/(m·° C.) to 3 W/(m·° C.). As described above, it can be said that thermal conductivity of a ceramic layer formed by using the thermal spraying is higher by one digit, compared to thermal conductivity of an insulator layer formed by solidifying ceramic particles using a binder formed of glass or a resin.

Accordingly, in the embodiment, heat resistance of an insulating layer of alumina formed by thermal spraying which is used as the first insulating layer 11 is approximately one tenth of heat resistance of an insulating layer formed by solidifying ceramic particles using a binder formed of glass or a resin, and the same heat resistance is obtained by estimation of a layer thickness of 500 µm of the former insulating layer and a layer thickness of 50 µm of the latter insulating layer. When dielectric strength voltage properties for the thicknesses are the same, the heat radiating properties become same, even when the former insulating layer has a dielectric strength voltage which is ten times a dielectric strength voltage of the latter insulating layer is ensured.

The inner portion of the first insulating layer 11 may be suitably configured with a plurality of layers.

(Thermal Spraying)

The thermal spraying is a method of causing fused particles obtained from thermal sprayed material fused or heated to a the fused state to rapidly collide with a base surface and laminate thereon, and the thermal sprayed material is supplied to a thermal spraying device in a powder or wire state. The thermal spraying is divided into flame spraying, arc spraying, plasma spraying, high velocity flame spraying, and the like according to a method of heating a thermal sprayed material. A cold spray method of causing a material to collide with a base material in a solid-solution state in a supersonic flow together with inert gas to form a coating film, without fusing the material is also classified as one kind of thermal spraying. The high velocity flame spraying, the plasma spraying, and the flame spraying are suitable for forming a ceramic layer on a metal base. Hereinafter, the high velocity flame spraying, the plasma spraying, and the flame spraying will be described.

It is possible to form a dense alumina layer having high adhesiveness according to the high velocity flame spraying (HVOF: High Velocity Oxygen Fuel). In the alumina layer formed as described above, it is possible to decrease a porosity (percentage of air holes occupying a film formed) which is an index of elaborateness of a film to be equal to or less than 1% and to stably realize high dielectric strength voltage properties. A layer thickness of an insulating layer obtained by this method is approximately 400 µm and currently, this is a limit.

In the high velocity flame spraying, oxygen and combustible gas combust in a combustion chamber under the high pressure. This combustion flame is narrowed down using a nozzle, the thermal sprayed material mixed into a rapid air flow generated by rapid expansion of gas when the combustion flame is exposed to the atmosphere is incorporated to, rapidly injected to, and laminated on the base. As a result, it is possible to realize a dense alumina layer.

Meanwhile, in the plasma spraying, plasma is generated by ionizing operative gas such as argon by performing arc discharge. A high-melting-point thermal sprayed material such as ceramic is heated and fused using this plasma and incorporated into a plasma flow blowing from a nozzle to cause fused particles to rapidly collide with a base surface and laminate ceramic. A maximum temperature of the base at the time of laminating a ceramic layer is approximately 200° C. and a porosity thereof is approximately 1% to 5% which is slightly higher than that in the velocity flame spraying, and accordingly, it is necessary to pay attention so that penetration holes are not formed in the ceramic layer, for maintaining a dielectric strength voltage.

In the plasma spraying, a material fused using combustion flame of oxygen and combustion gas is blown to the base in compressed air, and collides with the base and is laminated on the base. A maximum temperature of the base when laminating a ceramic layer is low as approximately 100° C., but a porosity thereof becomes high as 5% to 10%. Thus, it is necessary to perform the laminating to have a great film thickness than that of a ceramic layer formed by high velocity flame spraying or plasma spraying, in order to ensure excellent dielectric strength voltage properties.

As described above, in order to realize a dense ceramic layer having high dielectric strength voltage properties, a ceramic layer is preferably formed by using the high velocity flame spraying or the plasma spraying among the three methods described above, and in the embodiment, a case using the high velocity flame spraying will be described as an example, but there is no limitation. A ceramic layer may be formed by using the plasma spraying and other thermal spraying methods such as flame spraying can be used by suitably adjusting a layer thickness of a ceramic layer.

(Wiring Pattern)

The wiring pattern 3 formed on the first insulating layer 11 can be formed by a forming method of a wiring pattern of the related art, but a wiring pattern, in a case using the forming method of a wiring pattern of the related art, is configured with metal paste for an electrode base and a plating layer. An organic substance such as a resin is used as a binder in the metal paste for an electrode base, and accordingly, thermal conductivity was low and heat resistance was increased.

In addition, the surface of the first insulating layer 11 formed by the thermal spraying is normally convex and concave. When a circuit pattern for a base is formed by directly printing the metal paste onto the convex and concave surface, printing scratches may be generated in the circuit pattern for a base and unclearly printed portions may be obtained, due to the effect of the corrugation. These are causes of precipitation defects of plating and particularly, a short circuit between electrode terminals in a light emitting element mounting portion.

Accordingly, in the embodiment, the wiring pattern 3 is formed on the first insulating layer 11 by forming a copper conductive layer by using the high velocity flame spraying.

As shown in FIG. 2, in the substrate 20 for a light emitting device, since a copper conductive layer is directly formed on the first insulating layer 11 by using the high velocity flame spraying, excellent adhesiveness between the first insulating layer 11 and the wiring pattern 3 is obtained. Since a high-resistivity layer having low thermal conductivity is not interposed between the first insulating layer 11 and the wiring pattern 3, it is possible to realize the substrate 20 for a light emitting device having excellent heat radiating properties. In addition, the wiring pattern 3 is finally scraped from the conductive layer using etching after forming the conductive layer, and thus, there are no formation defects of electrodes or a short circuit between electrode terminals in a light emitting element mounting portion.

In the embodiment, copper is formed as a conductive layer for forming the wiring pattern 3, but there is no limitation and a conductive layer of silver may be formed.

In the embodiment, the widely used high velocity flame spraying is used, but there is no limitation and other thermal spraying methods can also be used. In order to prevent oxidation of metal used in the conductive layer, plasma spraying or a cold spraying method may be used. Particularly, a cold spraying method of causing a material to collide with a base material in a solid-solution state in a supersonic flow together with inert gas to form a coating film, without fusing the material, using inert gas as carrier gas is one of effective methods to be selected in order to extremely prevent oxidation of the conductive layer.

Exposed portions of the wiring pattern 3 are portions of terminals electrically connected to the light emitting elements, portions of the anode electrode (anode land) 7 and the cathode electrode (cathode land) 8 connected to an external wiring or an external device, and portions of the anode mark 9 and the cathode mark 10. The anode mark 9 and the cathode mark 10 may be formed on the second insulating film 12.

As a connecting method of the light emitting device 1 and an external wiring or an external device, the anode electrode (anode land) 7 and the cathode electrode (cathode land) 8 may be connected to an external wiring or an external device by soldering, or the light emitting device may be connected to an external wiring or an external device via connectors respectively connected to the anode electrode (anode land) 7 and the cathode electrode (cathode land) 8.

(Second Insulating Layer Having Light Reflectivity)

As shown in FIG. 2, in the substrate 20 for a light emitting device, the second insulating layer 12 having light reflectivity is formed on the first insulating layer 11 and on some parts of the wiring pattern 3, so that some parts of the wiring pattern 3 are exposed.

The second insulating layer 12 is formed of an insulating material which reflects light from the LED chips 4. In the embodiment, the second insulating layer 12 is formed of an insulating layer containing ceramic, and a layer thickness thereof can be set as, for example, approximately 10 µm to 500 µm by considering reflectivity of the substrate 20 for a light emitting device. An upper limit of this thickness is limited by the thickness of the wiring pattern 3. When the wiring pattern 3 formed of copper is exposed, the conductive pattern absorbs light, and accordingly, it is necessary to set the thickness which is great enough to coat the entire part of the wiring pattern 3, except for parts to be exposed. For example, in a case where a thickness of the conductive layer is set as 300 µm in order to increase heat radiating properties of the substrate, the second insulating layer 12 is also set to have an optimal thickness equal to or smaller than 300 µm, in order to coat the conductive layer, and in a case where a thickness of the conductive layer is set as 500 µm, the second insulating layer is set to have an optimal thickness equal to or smaller than 500 µm.

Since thermal conductivity of the second insulating layer 12 is lower than that of the first insulating layer 11 described above, the layer thickness of the second insulating layer 12 is preferably a minimum thickness necessary for obtaining desired reflectivity, and the layer thickness is suitable set to be approximately 50 µm to 100 µm as the thickness for achieving the object. In a case where the wiring pattern 3 has the maximum thickness and the coating is not sufficiently performed with this thickness, a third insulating layer may be interposed between the first insulating layer 11 and the second insulating layer 12, and thermal conductivity of this layer is desirably higher than that of the second insulating layer 12. As the third insulating layer, an insulating layer obtained by containing ceramic particles having excellent heat radiating properties in a glass binder or a resin binder may be used, a ceramic layer formed by using the thermal spraying may be used, or the same alumina layer as the first insulating layer may be used.

In the embodiment, the second insulating layer 12 having light reflectivity is formed of an insulating layer containing zirconia particles which are heat-resistivity ceramic particles, and this insulating layer is formed by sintering using a glass binder.

As described above, in the embodiment, since an aluminum base is used as the base 2 formed of a metal material and an insulating layer formed of alumina which is a ceramic layer is used as the first insulating layer 11, it is possible to increase a firing temperature to be a temperature lower than a melting point of the base 2 formed of a metal material, in a formation process of the second insulating layer 12 which is formed in a latter process.

The synthesis of vitreous matters by a sol-gel method is normally performed at 200° C. to 500° C., but firing is preferably performed at 400° C. to 500° C., in order to decrease holes from a porous film generated in a vitreous gel state.

Accordingly, in the embodiment, a sol used in the synthesis of vitreous matters by sol-gel method is used as a binder of zirconia particles and the second insulating layer 12 having light reflectivity is applied onto the first insulating layer 11 and some parts of the wiring pattern 3 by screen printing, so that some parts of the wiring pattern 3 are exposed, dried at 200° C. to 300° C., and fired with the finish at 400° C. to 500° C.

The formation of the second insulating layer 12 having light reflectivity may be performed using spray coating. In this method, the second insulating layer can be formed by coating a raw material by spray coating, drying and firing the material in the same manner as described above, and grinding some parts of the second insulating layer 12 to expose some parts of the wiring pattern 3.

In the embodiment, zirconia particles are used as the heat-resistivity ceramic particles, but there is no limitation, and titan oxide or aluminum nitride can also be used in addition to zirconia. Alumina can be used as the heat-resistivity ceramic particles, in order to reduce light absorption by coating the wiring pattern 3.

The ceramic described herein is not limited to a metal oxide, either, and is ceramic in a broad sense containing aluminum nitride and contains general inorganic solid materials. Among these inorganic solid materials, the ceramic may be any arbitrary materials, as long as it is a stable material having excellent heat resistance and thermal conductivity and a material which is excellent in heat reflection and light scattering. However, ceramic particles causing light absorption are not suitable. Specifically, the color of silicon nitride, silicon carbide, and the like is normally black and are not suitable for ceramic particles used in the second insulating layer 12.

In the embodiment, since an aluminum base is used as the base 2 formed of a metal material, the second insulating layer 12 is formed by sintering a glass-based binder using a sol-gel method at a firing temperature of 400° C. to 500° C., but there is no limitation, and the second insulating layer 12 can be formed by using a method other than the sol-gel method.

For example, a method of forming a vitreous layer by remelting an element obtained by solidifying low-melting-point glass particles with an organic binder is used. It is necessary to set at least a temperature of 800° C. to 900 for performing remelting. However, in the embodiment in which a ceramic layer represented by alumina is used as the first insulating layer 11, when the melting point of the base 2 formed of a metal material is set to be high as described below, a method of forming the second insulating layer 12 where a high temperature process is necessary, can be used.

That is, a melting point of the aluminum base exceeds 660° C. in such a high temperature process, and accordingly, in this case, it is necessary to use an alloy material having a high melting point obtained by suitably mixing impurities with aluminum, as a base material. In a case where copper is used as a base material, a melting point thereof is 1085°

C., and thus, copper can be used as it is, but copper may be used by increasing a melting point of a base by suitably mixing impurities therewith.

Since a vitreous layer has excellent light resistance and heat resistance, a vitreous layer is preferably used in the formation of the second insulating layer 12, and a resin having excellent heat resistance and light resistance can be used as a representative of a vitreous material. For example, the second insulating layer 12 may be formed by using a silicone resin, an epoxy resin, or a fluorine resin as a binder with respect to the ceramic particles. Although vitreous matters are deteriorated, it is advantageous that a hardening temperature is lower than that in the glass synthesis performed by a sol-gel method and a formation process is easily performed, from viewpoints of heat resistance and light resistance.

The inner portion of the second insulating layer 12 may be suitably configured with a plurality of layers.

According to such a configuration, since a layer having high thermal conductivity can be disposed on a layer of the second insulating layer 12 close to the first insulating layer 11 and a layer having high heat resistance can be disposed on a layer on a side opposite thereto, it is possible to realize a substrate for a light emitting device having high reflectivity, high heat radiating properties, dielectric strength voltage properties, long-term reliability containing heat resistance and light resistance. The values of thermal conductivity and heat resistance herein are relatively compared to each other in the second insulating layer 12.

(Light Emitting Element)

In FIG. 2, the LED chip 4 is mounted on the substrate 20 for a light emitting device to be packaged. Herein, the LED chip 4 is electrically connected to a terminal part of the wiring pattern 3 by flip chip bonding.

In the embodiment, an LED element is used as the light emitting element, but there is no limitation and an EL element and the like can be used.

In the embodiment, a light emitting element is formed of a sapphire substrate.

(Manufacturing Step of Substrate 20 for Light Emitting Device)

Hereinafter, a manufacturing step of the substrate 20 for a light emitting device will be described with reference to FIG. 3 and FIG. 4.

Figure 3:
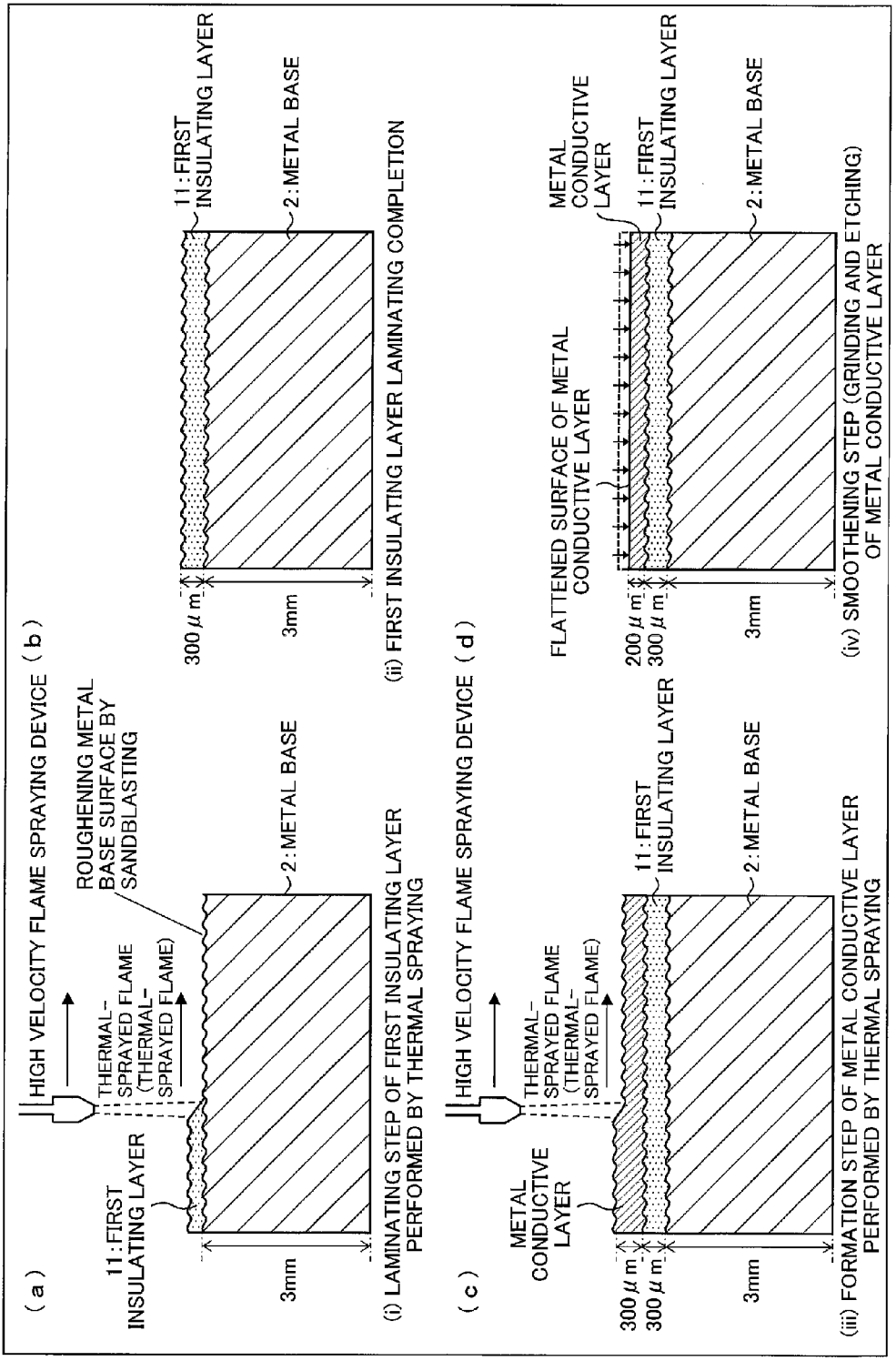
FIG. 3 is a diagram for illustrating a manufacturing step of the substrate 20 for a light emitting device included in the light emitting device 1 shown in FIG. 1.

First, in a laminating step (1) of the first insulating layer 11 performed by thermal spraying, as shown in FIG. 3(*a*), a surface of one side (side where the first insulating layer 11 is formed) of an aluminum base having a thickness of 3 mm used as the metal base 2 was roughened by sandblasting, and then, the first insulating layer 11 formed of alumina was formed using a high velocity flame spraying device.

As shown in FIG. 3(*b*), the first insulating layer 11 having a thickness of 300 μm was completed (first insulating layer 11 laminating completion (2)).

In the embodiment, a case of using a high velocity flame spraying device is described, but the first insulating layer 11 may be formed by using a plasma spraying device, instead of a high velocity flame spraying device.

In the embodiment, a surface of one side of an aluminum base is roughened by sandblasting, in order to improve adhesiveness between the metal base 2 and the first insulating layer 11, but this step may be suitably performed as necessary, and can be suitably omitted depending on materials of the metal base 2 and the first insulating layer 11.

Then, in a formation step (3) of a metal conductive layer performed by thermal spraying, as shown in FIG. 3(*c*), a copper conductive layer having a thickness of 300 μm was formed on the first insulating layer 11 as a metal conductive layer using a high velocity flame spraying device. Even in this step, the copper conductive layer may be formed by using a plasma spraying device, instead of a high velocity flame spraying device. In the formation of the copper conductive layer, a cold spray method is also an effective method for reducing oxidation of copper. In the embodiment, the metal conductive layer is formed by thermal spraying, but the metal conductive layer may be formed by a method other than the thermal spraying.

For example, after forming a thin conductive layer by thermal spraying with respect to the first insulating layer 11 formed by thermal spraying, a copper conductive layer may be precipitated to be thick by plating treatment. Alternatively, for example, an electrode layer may be formed by using printing of metal paste and formation of plating, in the related art. When a conductive layer is formed by thermal spraying with respect to the first insulating layer 11 formed by thermal spraying, adhesiveness is high and thermal resistance is low, and accordingly, it is also preferable that a metal conductive layer is at least formed on a portion coming into contact with the first insulating layer 11 by thermal spraying.

After that, in a smoothening step (4) of a metal conductive layer, as shown in FIG. 3(*d*), a copper conductive layer having a smooth surface was obtained by grinding and dry-etching a copper conductive layer formed to have a thickness of 300 μm to soften the surface thereof. A layer thickness of the smoothened copper conductive layer was 200 μm. In the embodiment, the dry etching was performed after the grinding, as the smoothening treatment, but there is no limitation, and wet etching was performed after the grinding, as the smoothening treatment.

Figure 4:
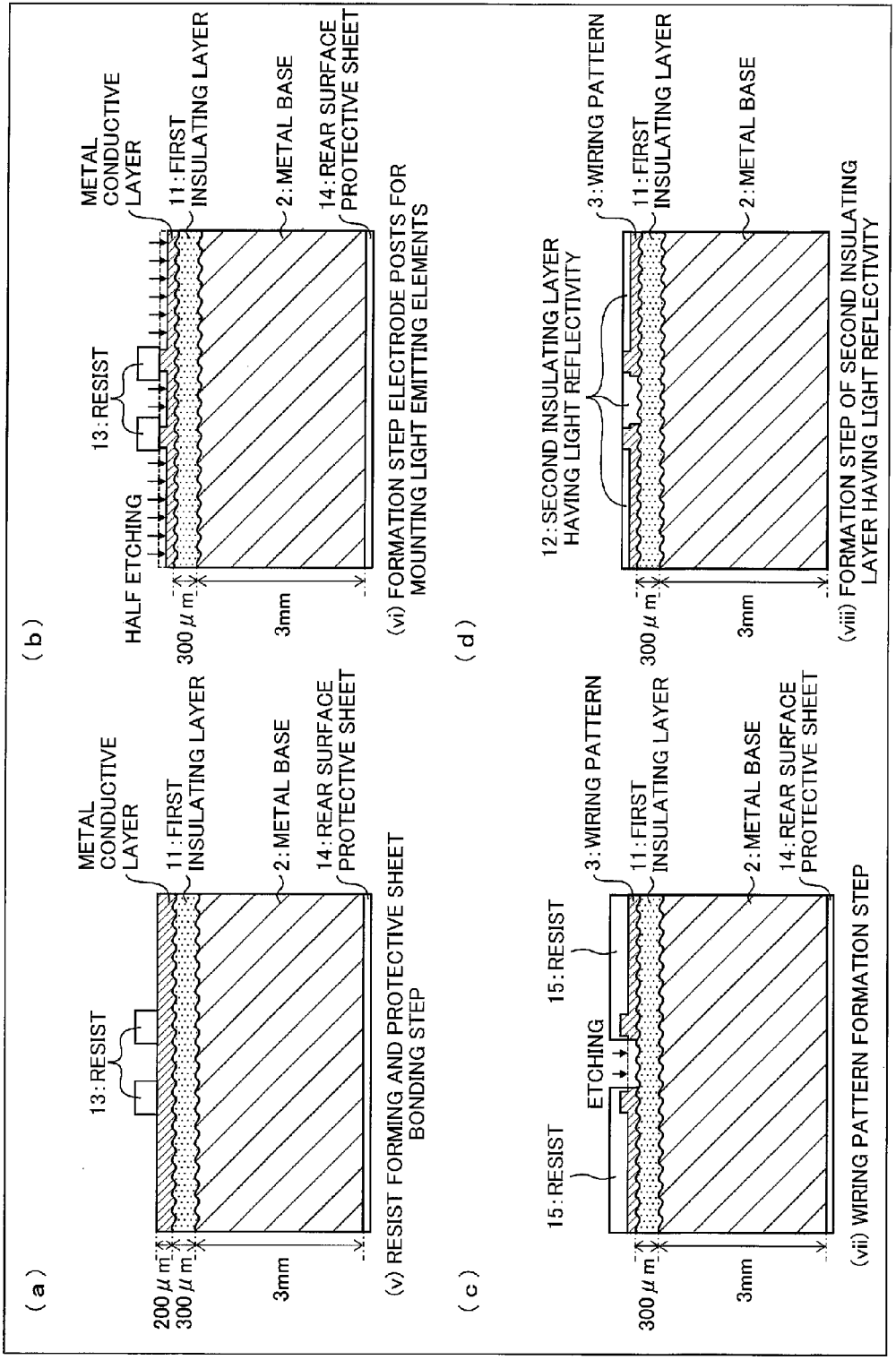
FIG. 4 is a diagram for illustrating a manufacturing step of the substrate 20 for a light emitting device included in the light emitting device 1 shown in FIG. 1.

In a resist forming and protective sheet bonding step (5), as shown in FIG. 4(*a*), first, a rear surface protective sheet 14 was formed on a surface of the metal base 2 opposing to a surface where the first insulating layer 11 was formed. The rear surface protective sheet 14 is for preventing damage to the metal base 2, when forming resists 13 in a predetermined pattern.

In the embodiment, a case where the rear surface protective sheet 14 is formed on a surface of the metal base 2 opposing to a surface where the first insulating layer 11 is formed is described, but it is also preferable to provide a protective sheet on side surfaces of the metal base 2. After that, the resists 13 were formed on the entire surface of the smoothened copper conductive layer, and a pattern of the resists 13 was formed so that resists 13 remain in terminal portions (electrode posts) of the copper conductive layer for electrical connection with respect to light emitting elements (LED chips 4). It is necessary to perform at least coating, exposing, and developing steps, in order to form the resists 13 in a predetermined pattern, and thus, the rear surface protective sheet 14 protects the metal base 2, during these steps. In the embodiment, the rear surface protective sheet 14 was used, but there is no limitation, and an aluminum anodic oxidation coating (alumite layer) may be formed on side surfaces and a rear surface of an aluminum base, for example, instead of the protective sheet. In addition, it is more preferable to perform sealing treatment with respect to this aluminum anodic oxidation coating (alumite layer).

Then, in a formation step (6) of terminal portions (electrode posts) for mounting light emitting elements (LED chips 4), as shown in FIG. 4(*b*), terminal portions (electrode posts) were formed on a copper conductive layer by performing half etching of the copper conductive layer which is a metal conductive layer by using dry etching, by using resists 13 as a mask.

Regarding the manufacturing step of the substrate 20 for a light emitting device, a case where the pattern of the resists 13 was formed so that resists 13 remain in terminal portions (electrode posts) of the copper conductive layer for electrical connection with respect to light emitting elements (LED chips 4) has been described, but in the same manner as described above, it is desirable that the anode electrode (anode land) 7, the cathode electrode (cathode land) 8, anode mark 9, and the cathode mark 10 are respectively formed on a copper conductive layer, by forming a pattern of the resists 13 so that the resists 13 remain in a portion where the anode electrode (anode land) 7, the cathode electrode (cathode land) 8, anode mark 9, and the cathode mark 10 are formed, and performing half etching of the copper conductive layer which is a metal conductive layer by using dry etching, by using resists 13 as a mask (not shown in FIG. 4(*a*)).

After that, in a wiring pattern formation step (7), first, after peeling off and removing the resists 13 shown in FIG. 4(*b*), resists 15 were formed so that only a region between the electrode portions (electrode posts) of the copper conductive layer is exposed, as shown in FIG. 4(*c*). Then, the wiring pattern 3 was completed by performing dry etching (or wet etching) of the copper conductive layer by using resists 15 as a mask and electrically separating two terminal portions (electrode posts).

In a formation step (8) of the second insulating layer 12 having heat reflectivity, first, after peeling off and removing the resists 15 shown in FIG. 4(*c*), the second insulating layer 12 was completed by coating vitreous matters containing zirconia particles by screen printing so that the terminal portions (electrode posts) of the copper conductive layer are exposed, performing drying at 200° C. to 300° C., and performing firing at 400° C. to 500° C., as shown in FIG. 4(*d*). In the embodiment, since the screen printing is used, a step of exposing the terminal portions (electrode posts) is not separately necessary.

In a case of forming the second insulating layer 12 having light reflectivity using the screen printing, it is necessary to perform a step of separately exposing the terminal portions (electrode posts) by coating a raw material by spray coating, drying and firing the material in the same manner as described above, and grinding some parts of the second insulating layer 12.

Finally, the substrate 20 for a light emitting device including the LED chips 4 shown in FIG. 2 was completed by performing the flip chip bonding of the LED chips 4 as flip-chip type light emitting elements to the terminal portions of the wiring pattern 3 of the substrate 20 for a light emitting device for causing electrical connection. As the electrical bonding, bonding may be suitably performed by a Au bump method or soldering.

In the embodiment, an outer shape of the base 2 in a base surface direction is hexagon, but the outer shape of the base 2 is not limited thereto, and arbitrary closed figure shapes can be used. The closed figure shape may be a closed figure shape in which circumference of a closed figure is configured with only a linear line or only a curve, or the closed figure shape may be a closed figure shape in which circumference of a closed figure contains at least a linear portion and at least a curved portion. The closed figure shape is not limited to a convex figure shape and may be a concave figure shape. For example, as an example of a convex polygonal shape configured with only a linear line, shapes of a triangle, a square, a pentagon, an octagon, and the like may be used, or arbitrary concave figure shapes may be used. As an example of a closed figure shape configured with only a curve, a circular shape or an elliptical shape may be used, or a closed figure shape such as a shape having a convex curve or a shape having a concave curve may be used. In addition, a shape of a racetrack may be used as a closed figure shape containing at least a linear portion and at least a curved portion.

Modified Example 1 of Embodiment 1

Figure 16:
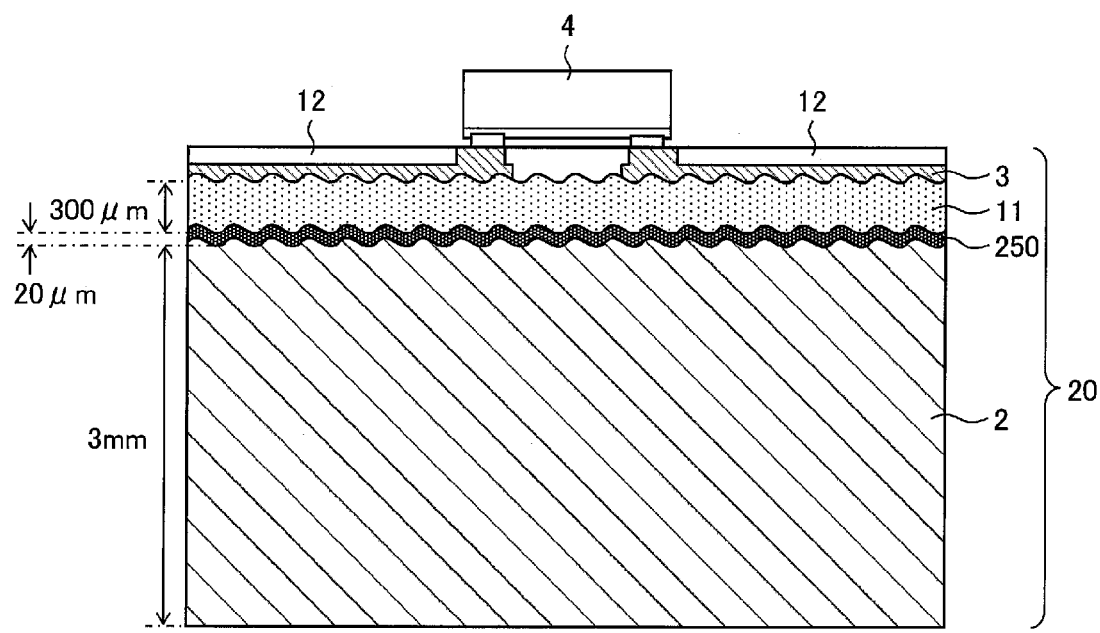
FIG. 16 is a sectional view showing a schematic configuration of a modified example of the substrate 20 for a light emitting device included in the light emitting device 1 shown in FIG. 1.

A modified example of Embodiment 1 of the invention will be described as follows with reference to FIG. 16. FIG. 16 is a diagram showing a modified example of the substrate 20 for a light emitting device of Embodiment 1 shown in FIG. 2.

In the modified example, a buffer layer 250 is formed between the metal base 2 and the first insulating layer 11 as shown in FIG. 16 and this is a different point from Embodiment 1. In Embodiment 1, in a case where the first insulating layer 11 is formed on the base formed of metal such as an aluminum plate to form a substrate for a light emitting device, particularly, in a case where this is used as a high-output substrate for a light emitting device, the base formed of metal is repeatedly expanded and contracted due to effects of heat generating in the light emitting elements loaded on the substrate. Accordingly, the first insulating layer 11 formed on the base may be peeled off or have deteriorated dielectric strength voltage properties due to mechanical loads received due to a difference in a coefficient of linear expansion between the first insulating layer and the metal base. In addition, the light emitting elements loaded on the base may also have a decreased lifetime due to effects of heat history received due to a difference in a coefficient of linear expansion between the first insulating layer and the metal base. Therefore, in this modified example, the buffer layer 250 is formed between the metal base 2 and the first insulating layer 11 as shown in FIG. 16.

The metal base 2 is a substrate formed of a material having high thermal conductivity. The material of the metal base 2 is not particularly limited, as long as it is a material having high thermal conductivity, and a substrate formed of metal containing aluminum, copper, stainless steel, or iron as a material can be used, for example.

The buffer layer 250 is a film formed by performing thermal spraying or an aerosol deposition method (AD method) with respect to one surface (hereinafter, referred to as a surface) of the metal base 2 and is formed of a material having a smaller coefficient of linear expansion than that of the metal base 2. It is preferable that the coefficient of linear expansion of the buffer layer 250 is greater than that of the first insulating layer 11. A thickness of the buffer layer 250 is from 10 μM to 100 μm and is preferably from 20 μm to 30 μm.

Since the buffer layer 250 having a coefficient of linear expansion smaller than that of the metal base 2 and close to that of the first insulating layer 11 is interposed therebetween, it is possible to significantly decrease transmission of mechanical loads to the light emitting elements due to thermal expansion and contraction of the metal base 2, and therefore, it is possible to increase a length of lifetime of the LED chips 4 (light emitting elements) and the light emitting device 1 and to improve reliability.

The buffer layer 250 is desirably a metal or alloy layer, and metal containing at least any one of metals having a small coefficient of linear expansion such as Ni, Ti, Co, Fe, Nb, Mo, Ta, and W, or an alloy thereof is used as a material of metal or alloy layer used for the buffer layer 250.

Particularly, in a case where the metal base 2 is an aluminum material, the buffer layer 250 contains at least any one of Ni, Ti, and Co as a material, and particularly preferably, the buffer layer 250 desirably contains Ni as a material.

In addition, in order to increase adhesiveness with the metal base 2 formed of aluminum, the buffer layer 250 is preferably an alloy of Ni (nickel) and aluminum. In a case where the buffer layer 250 is an alloy of Ni (nickel) and aluminum, a rate of Ni is desirably increased as much as possible and the rate of nickel in the buffer layer 250 is desirably equal to or greater than 90% as a weight ratio, in order to obtain a coefficient of linear expansion close to a substantially intermediate value of the coefficients of linear expansion of the metal base 2 and the first insulating layer 11.

As will be described later, this is because the coefficient of linear expansion of nickel is $13.4 \times 10^{-6}/°$ C. and this substantially coincides with $15 \times 10^{-6}/°$ C. which is an intermediate value of coefficients of linear expansion of both of aluminum and alumina which is a representative ceramic material. It is possible to make the coefficient of linear expansion of the buffer layer 250 fall in a range of $13 \times 10^{-6}/°$ C. to $16 \times 10^{-6}/°$ C. which is close to $15 \times 10^{-6}/°$ C. described above, by setting the rate of nickel in the buffer layer 250 formed an alloy of nickel and aluminum to be equal to or greater than 90% as a weight ratio.

A melting point of Ni is determined to be low among metals described above, but is practically high as 1455° C. When an alloy of Al and Ni is used, it is possible to decrease a melting point, and the alloy described above is suitable for forming a nickel layer by thermal spraying, for example, because a temperature necessary for preparing a fused state or a half-fused state is decreased.

In a case where the material of the metal base 2 is aluminum and the material of the first insulating layer 11 is alumina, the coefficient of linear expansion of Ni is substantially an intermediate value of the coefficients of linear expansion of aluminum and alumina, and thus Ni is suitable as the buffer layer.

When coefficients of linear expansion of metals described above are compared at room temperature, coefficients of linear expansion of Ni (nickel), Ti (titanium), and Co (cobalt) are respectively $13.4 \times 10^{-6}/°$ C., $8.6 \times 10^{-6}/°$ C., and $13.0 \times 10^{-6}/°$ C. which are smaller than $23 \times 10^{-6}/°$ C. which is a coefficient of linear expansion of aluminum. With respect to this, since a coefficient of linear expansion of alumina which is representative ceramic material is from $6 \times 10^{-6}/°$ C. to $8 \times 10^{-6}/°$ C. and is substantially $7 \times 10^{-6}/°$ C., Ni (nickel) and Co (cobalt) have substantially intermediate coefficients of linear expansion with respect to those of aluminum and ceramic, and thus, are more suitable as metal used in the buffer layer.

The coefficients of linear expansion greatly vary depending on a glass composition, but the coefficients of linear expansion are substantially from $3 \times 10^{-6}/°$ C. to $9 \times 10^{-6}/°$ C. and are coefficients of linear expansion comparatively close to that of alumina.

The buffer layer 250 is formed by thermal spraying or an aerosol deposition method (AD method).

A formation method performed by thermal spraying is a method described below. The AD method is a technology of mixing raw materials of fine particles ultrafine particles prepared by another method in advance with gas for performing aerosolizing, and ejecting the aerosolized material to a substrate through nozzles to form a coating film.

The surface of the base may be roughened by blasting, before forming the buffer layer 250, in order to further improve adhesiveness between the metal base 2 and the buffer layer 250.

Modified Example 2 of Embodiment 1

In Modified Example 1, the buffer layer 250 is a metal or alloy layer, but the invention is not limited thereto, and the buffer layer 250 may be formed using a resin formed in a sheet shape or a paste-like resin, instead thereof.

In this case, an additive may be suitably added, in order to adjust physical properties such as thermal conductivity and a coefficient of linear expansion of the buffer layer 250, and ceramic particles, glass fibers, metal particles, and the like are used as an additive.

A resin configuring the buffer layer 250 may be selected from an epoxy resin, a silicone resin, a polyimide resin, and a fluorine resin having excellent heat resistance.

More specifically, a commercially available insulating sheet for a radiation board may be used as the buffer layer 250. Since an epoxy resin is used as a binder in the ceramic particles, a coefficient of linear expansion of the commercially available insulating sheet for a radiation board is $10 \times 10^{-6}/°$ C. to $15 \times 10^{-6}/°$ C., and indicates an intermediate coefficient of linear expansion of the coefficient of linear expansion of aluminum which is $23 \times 10^{-6}/°$ C. and the coefficient of linear expansion of alumina as a representative ceramic material which is $7 \times 10^{-6}/°$ C. In addition, the insulating sheet described above shows excellent thermal conductivity and dielectric strength voltage properties in which the thermal conductivity is 5 W/(m·K) and dielectric strength voltage properties with a thickness of 100 μm is equal to or greater than 5 kV.

Embodiment 2

Figure 6:
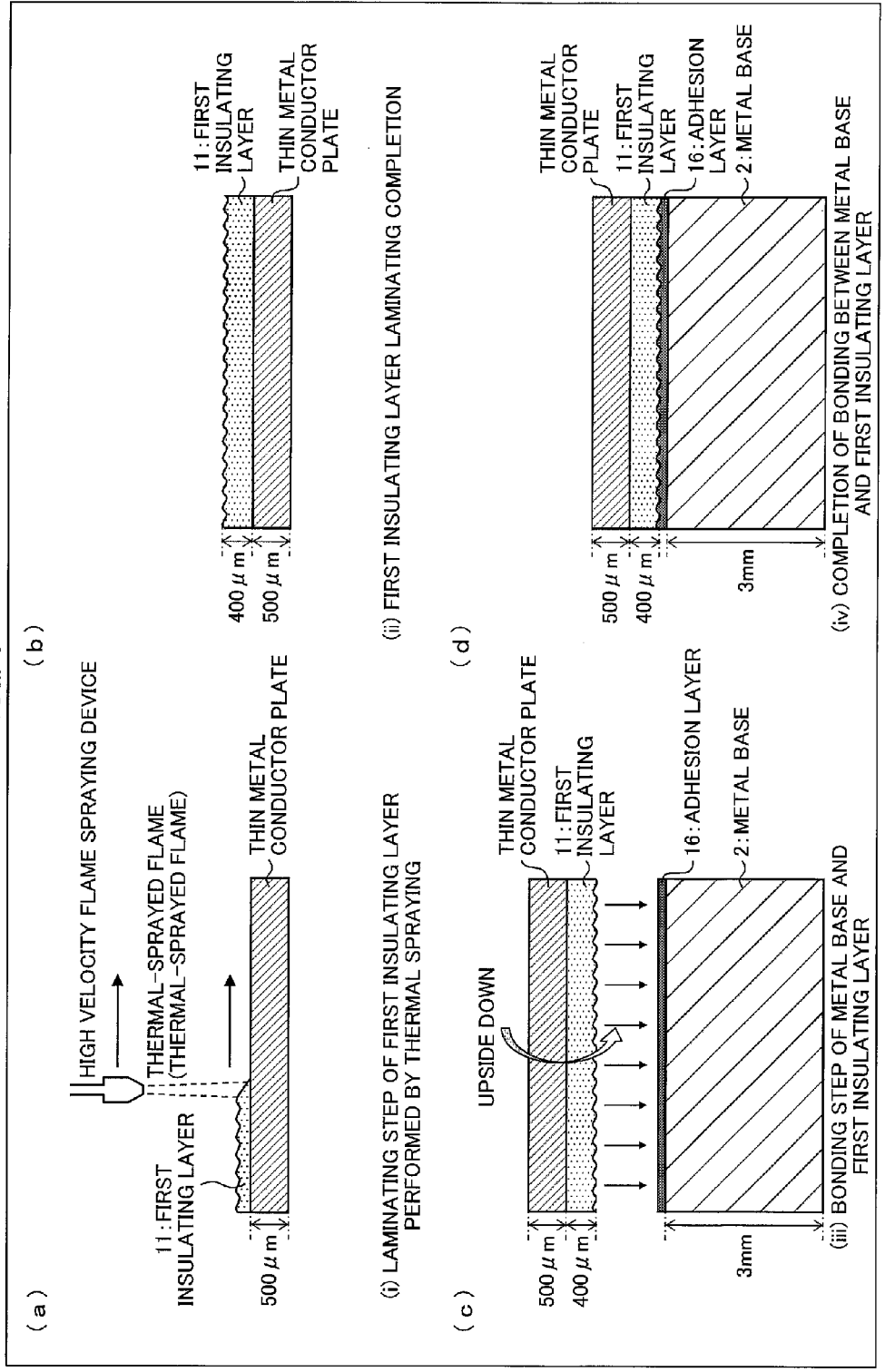
FIG. 6 is a diagram for illustrating a manufacturing step of the substrate 20a for a light emitting device shown in FIG. 5.
Figure 7:
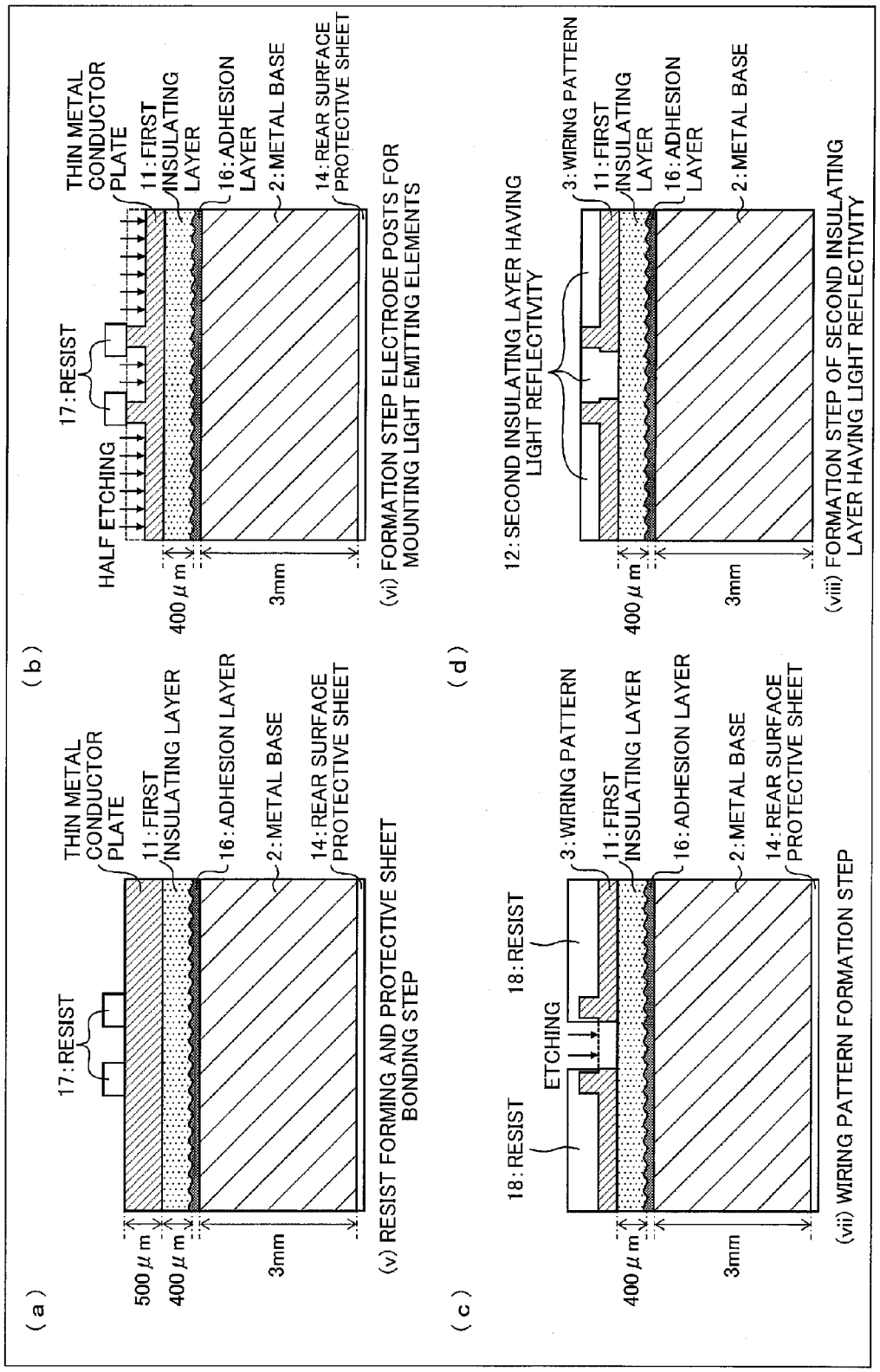
FIG. 7 is a diagram for illustrating a manufacturing step of the substrate 20a for a light emitting device shown in FIG. 5.

Next, Embodiment 2 will be described with reference to FIG. 5, FIG. 6, and FIG. 7. A substrate 20a for a light emitting device described in this embodiment is different from the substrate 20 for a light emitting device described in Embodiment 1, in that an adhesion layer 16 is provided between the metal base 2 and the first insulating layer 11. For convenience of description, the same reference numerals are used for the members having the same functions as those of members shown in the drawings of Embodiment 1 and the description thereof will be omitted.

Figure 5:
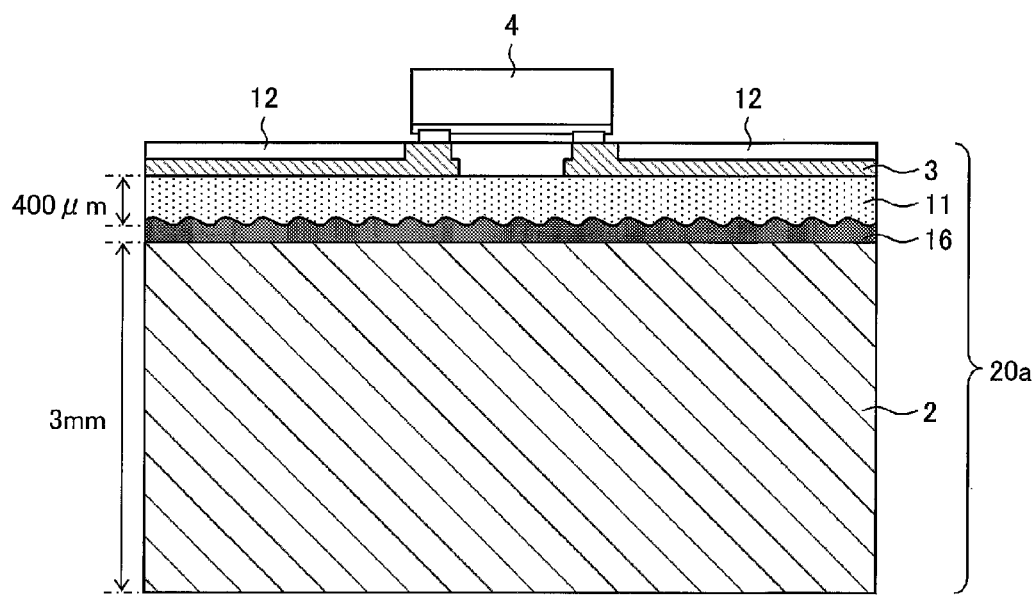
FIG. 5 is a sectional view showing a schematic configuration of a substrate 20a for a light emitting device.

FIG. 5 is a sectional view showing a schematic configuration of the substrate 20a for a light emitting device.

As shown in the drawing, the substrate 20a for a light emitting device includes the base 2 formed of a metal material, the base 2 formed of a metal material, the adhesion layer 16 which is formed on one surface of the base 2, the first insulating layer 11 having thermal conductivity which is formed on the adhesion layer 16, the wiring pattern 3 which is formed on the first insulating layer 11, and the second insulating layer 12 having light reflectivity which is formed on the first insulating layer 11 and on some parts of the wiring pattern 3, so that some parts of the wiring pattern 3 are exposed.

(Manufacturing Step of Substrate 20a for a Light Emitting Device)

Hereinafter, a manufacturing step of the substrate 20a for a light emitting device will be described with reference to FIG. 6 and FIG. 7.

First, in a laminating step (1) of the first insulating layer 11 performed by thermal spraying, as shown in FIG. 6(a), a thin copper (Cu) plate having a thickness of 500 μm was used as a thin metal conductive plate. Then, the first insulating layer 11 formed of alumina was formed on the thin copper (Cu) plate using a high velocity flame spraying device.

As shown in FIG. 6(b), the first insulating layer 11 having a thickness of 400 μm was completed (first insulating layer 11 laminating completion (2)).

In the embodiment, a case of using a high velocity flame spraying device is described, but the first insulating layer 11 may be formed by using a plasma spraying device, instead of a high velocity flame spraying device.

In the embodiment, a surface of one side of the thin copper (Cu) plate may be roughened by sandblasting, in order to improve adhesiveness between the thin copper (Cu) plate and the first insulating layer 11.

In this embodiment, the thin copper (Cu) plate is used, but there is no limitation, and a thin silver plate and the like may be used.

Then, in a bonding step (3) of a metal base and the first insulating layer 11, as shown in FIG. 6(c), first, an aluminum base having a thickness of 3 mm was used as the metal base 2 and the adhesion layer 16 formed of a brazing material (AgCuTi-based) was formed on the aluminum base. The thin copper (Cu) plate on which the first insulating layer 11 shown in FIG. 6(b) is formed is flipped upside down and the metal base 2 and the first insulating layer 11 are bonded to each other through the adhesion layer 16 in a vacuum state or inert gas. Therefore, as shown in FIG. 6(d), a substrate for a light emitting device in which the metal base 2 and the first insulating layer 11 are bonded to each other was obtained (completion of bonding between metal base and first insulating layer (4)).

A resist forming and protective sheet bonding step (5) shown in FIG. 7(a) is the same as the resist forming and protective sheet bonding step (5) shown in FIG. 4(a) described in Embodiment 1, a formation step (6) of electrode posts for mounting light emitting elements shown in FIG. 7(b) is the same as the formation step (6) of electrode posts for mounting light emitting elements shown in FIG. 4(b) described in Embodiment 1, a wiring pattern formation step (7) shown in FIG. 7(c) is the same as the wiring pattern formation step (7) shown in FIG. 4(c) described in Embodiment 1, and a formation step (8) of the second insulating layer having heat reflectivity shown in FIG. 7(d) is the same as the formation step (8) of the second insulating layer having heat reflectivity shown in FIG. 4(d) described in Embodiment 1, and therefore, the description will be omitted herein.

As described above, in this embodiment, the formation step (3) of a metal conductive layer performed by thermal spraying shown in FIG. 3(c) described in Embodiment 1 can be omitted by using the thin copper (Cu) plate and the adhesion layer 16.

In this embodiment, a case where a thickness of the thin copper (Cu) plate is 500 μm, a thickness of the first insulating layer 11 is 400 μm, and a thickness of the metal base 2 is 3 mm is used, as an example, but respective thicknesses thereof may be from 200 μm to 1 mm, from 100 μm to 500 μm, and from 1 mm to 5 mm, for example, and an optimal thickness may be selected, as necessary.

Embodiment 3

Next, Embodiment 3 will be described with reference to FIG. 8. A substrate for a light emitting device described in this embodiment is different from the substrates for a light emitting device described in Embodiments 1 and 2, in that the first insulating layer 11 is also formed on side surfaces of the metal base as a protective film (protective layer). For convenience of description, the same reference numerals are used for the members having the same functions as those of members shown in the drawings of Embodiments 1 and 2 and the description thereof will be omitted.

Figure 8:
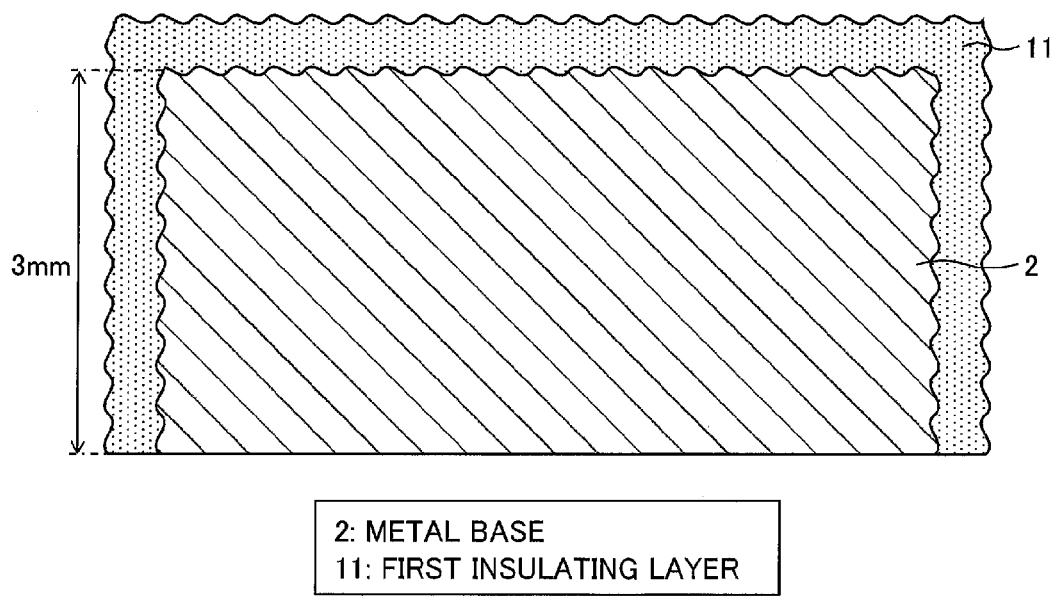
FIG. 8 is a sectional view showing a schematic configuration of a substrate for a light emitting device in which a first insulating layer 11 is also formed on side surfaces of a metal base 2 as a protective film.

FIG. 8 is a sectional view showing a schematic configuration of a substrate for a light emitting device in which the first insulating layer 11 is also formed on side surfaces of the metal base 2 as a protective film.

In the laminating step (1) of the first insulating layer 11 performed by thermal spraying shown in FIG. 3(a) or the resist forming and protective sheet bonding step (5) shown in FIG. 4(a) in Embodiment 1, the first insulating layer 11 can also be formed on side surfaces of the metal base 2 by thermal spraying as a protective film, as shown in FIG. 8.

In addition, in the laminating step (1) of the first insulating layer 11 performed by thermal spraying shown in FIG. 6(a) or the resist forming and protective sheet bonding step (5) shown in FIG. 7(a) in Embodiment 2, the first insulating layer 11 can also be formed on side surfaces of the metal base 2 by thermal spraying as a protective film, as shown in FIG. 8.

With such a configuration, it is possible to prevent damages on the metal base 2 in the post processing or after completing a product, improve long-term reliability, and control dielectric strength voltage properties using a protective film.

It is preferable that the buffer layer 250 described in the modification example of Embodiment 1 is formed between the metal base 2 and the first insulating layer 11.

The buffer layer 250 is the same buffer layer described in modification examples 1 and 2 of Embodiment 1 and has been described in modification examples 1 and 2 of Embodiment 1, and thus the description thereof will be omitted herein.

In a case of forming the buffer layer 250 between the metal base 2 and the first insulating layer 11, the material of the metal base 2 is not particularly limited, as long as it is a material having high thermal conductivity, and substrate formed of metal containing aluminum, copper, stainless steel, or iron as a material can be used, for example.

Embodiment 4

Embodiment 4 will be described with reference to FIG. 9. A substrate for a light emitting device described in this embodiment is different from the substrates for a light emitting device described in Embodiments 1 to 3, in that the protective film 19 (protective layer) is not only formed on the side surfaces of the metal base 2 but also formed on a surface (rear surface of the metal base 2) opposing the surface where the first insulating layer 11 is formed, and the rear surface protective sheet 14 is not used. For convenience of description, the same reference numerals are used for the members having the same functions as those of members shown in the drawings of Embodiments 1 to 3 and the description thereof will be omitted.

FIG. 9(a) is a diagram showing a case where the protective film 19 is not only formed on the side surfaces of the metal base 2 but also formed on a surface (rear surface of the metal base 2) opposing the surface where the first insulating layer 11 is formed, in the substrate 20 for a light emitting device described in Embodiment 1, and FIG. 9(b) is a diagram showing a case where the protective film 19 is not only formed on the side surfaces of the metal base 2 but also formed on a surface (rear surface of the metal base 2) opposing the surface where the first insulating layer 11 is formed, in the substrate 20a for a light emitting device described in Embodiment 2. That is, in the configurations shown in FIG. 9(a) and FIG. 9(b), all of the surfaces of the metal base 2 (entire portion of the metal base 2) are covered with a protective film (protective layer), when the first insulating layer 11 is included.

Figure 9:
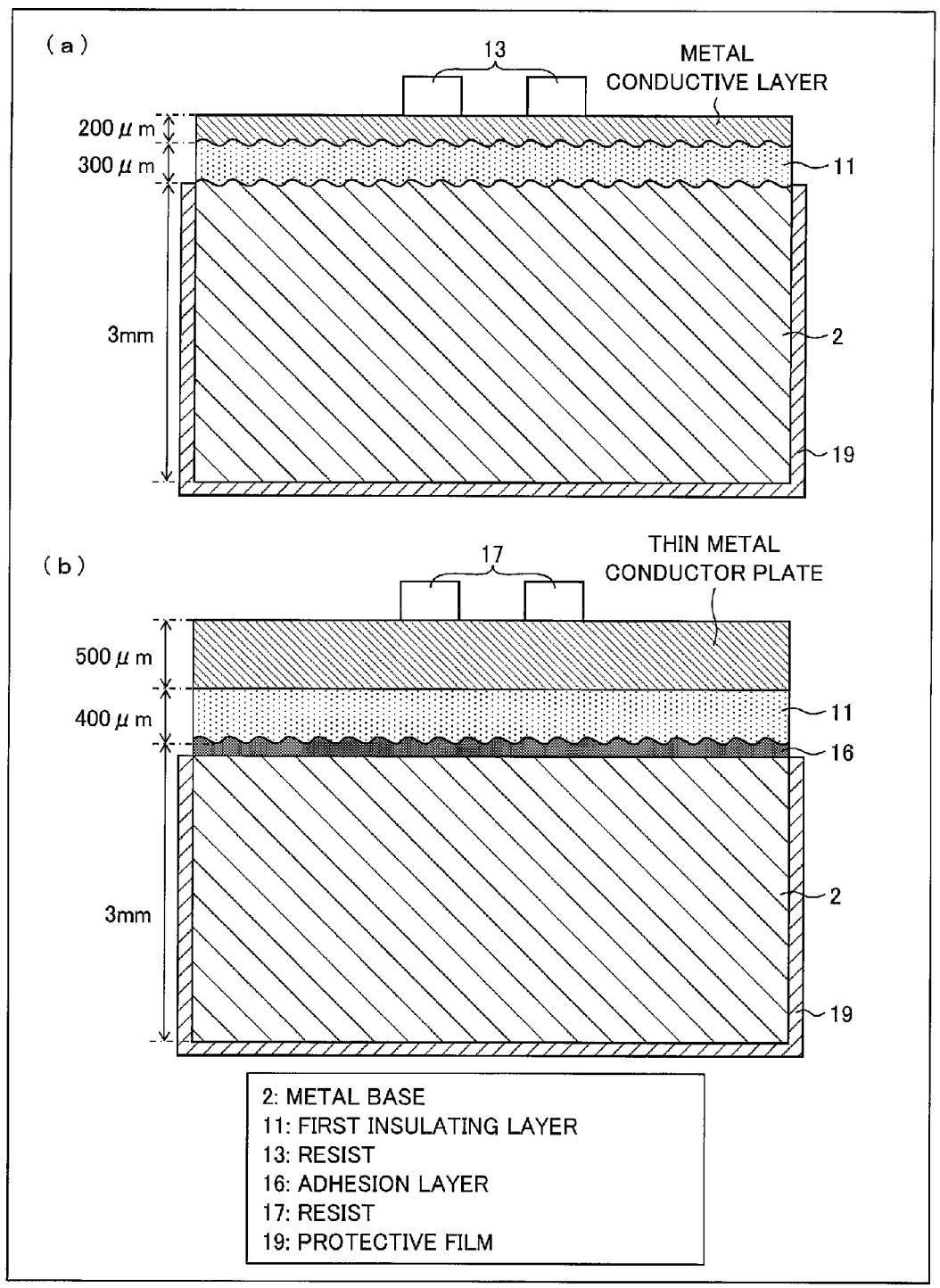
FIG. 9 is a sectional view showing a schematic configuration of a substrate for a light emitting device in which a protective film 19 is not only formed on the side surfaces of the metal base 2 but also on a surface (rear surface of the metal base 2) opposing the surface where the first insulating layer 11 is formed.

In the laminating step (1) of the first insulating layer 11 performed by thermal spraying shown in FIG. 3(a) or the resist forming and protective sheet bonding step (5) shown in FIG. 4(a) in Embodiment 1, the protective film 19 is not only formed on the side surfaces of the metal base 2 but can also be formed on a surface (rear surface of the metal base 2) opposing the surface where the first insulating layer 11 is formed, as shown in FIG. 9.

In addition, in the laminating step (1) of the first insulating layer 11 performed by thermal spraying shown in FIG. 6(a) or the resist forming and protective sheet bonding step (5) shown in FIG. 7(a) in Embodiment 2, the protective film 19 is not only formed on the side surfaces of the metal base 2 but can also be formed on a surface (rear surface of the metal base 2) opposing the surface where the first insulating layer 11 is formed, as shown in FIG. 9.

The protective film 19 may be the first insulating layer 11 formed by the thermal spraying, and in a case where the metal base 2 is an aluminum base, the protective film 19 may be an aluminum anodic oxidation coating (alumite layer). In a case of using an aluminum anodic oxidation coating (alumite layer) as the protective film 19, it is more preferable to perform sealing treatment with respect to this aluminum anodic oxidation coating (alumite layer).

In a case where it is necessary to increase a layer thickness of the first insulating layer 11, for obtaining desired dielectric strength voltage properties, it is considered to increase heat resistance to a value equal to or greater than an assumed value. In such a case, as described in this embodiment, in order to avoid the necessity described above, some parts of the first insulating layer 11 can be disposed on the rear surface of the metal base 2 to be separated from the light emitting elements which are heat sources, by providing the protective film 19 formed of the same material as that of the first insulating layer 11 on the rear surface of the metal base 2. The some parts of the first insulating layer 11 having thermal conductivity lower than that of the metal base 2 are disposed as the protective film 19 to be separated from the light emitting elements, and accordingly, it is possible to decrease heat resistance of the protective film 19, even when the thermal conductivity is not changed. This is because heat is diffused in a substrate horizontal direction until heat passes through the protective layer 19.

As described above, a contribution rate of the heat resistance generated in the protective film 19 with respect to the entire heat resistance can be significantly decreased, compared to the case of the first insulating layer 11. Accordingly, the thickness of the protective film 19 may be sufficiently increased to increase insulating properties. At this time, effects to the entire heat resistance are slight, a high thermal electric withstanding pressure is obtained and heat resistance can be decreased.

Specifically, in a case where the thickness of the first insulating layer 11 exceeds, for example, 500 µm, heat resistance for one light emitting element increases, and accordingly, it is particularly desirable to use the configuration described above. Even when the thickness of the first insulating layer 11 is equal to or smaller than the value described above, in a case where it is necessary to give priority to heat radiating properties, it is strongly recommended that insulating properties of the substrate is ensured by the protective film 19, not the first insulating layer 11.

As described above, general insulating properties are obtained from the first insulating layer 11 formed on the upper surface of the metal base 2 or from the protective film 19 formed on the lower surface of the metal base 2, and this depends on the purpose of the light emitting device, and accordingly, this cannot be determined only by heat resistance or ease of manufacturing method.

In the substrate for a light emitting device of FIG. 9(a) of this embodiment, it is more preferable that the buffer layer 250 described in the modified examples of Embodiment 1 is formed between the metal base 2 and the first insulating layer 11.

In the substrate for a light emitting device of FIG. 9(a) and FIG. 9(b) of this embodiment, it is more preferable that the buffer layer 250 is formed between the metal base 2 and the protective film 19, in a case where the protective film 19 is the first insulating layer 11 formed by thermal spraying.

The buffer layer 250 is the same buffer layer described in modification examples 1 and 2 of Embodiment 1 and has been described in modification examples 1 and 2 of Embodiment 1, and thus the description thereof will be omitted herein.

In a case where the buffer layer 250 is formed between the metal base 2 and the first insulating layer 11, the material of the metal base 2 is not particularly limited, as long as it is a material having high thermal conductivity, and a substrate formed of metal containing aluminum, copper, stainless steel, or iron as a material can be used, for example.

Embodiment 5

Next, Embodiment 5 will be described with reference to FIG. 10. A substrate 20' for a light emitting device described in this embodiment is different from the substrates for a light emitting device described in Embodiments 1 to 4, in that copper paste which is metal paste is used in the formation of a wiring pattern 3' and a thermal-sprayed alumina layer (first insulating layer 11) is coated with a smoothening layer 21 (third insulating layer) which is an alumina-containing glass layer. For convenience of description, the same reference numerals are used for the members having the same functions as those of members shown in the drawings of Embodiments 1 to 4 and the description thereof will be omitted.

Figure 10:
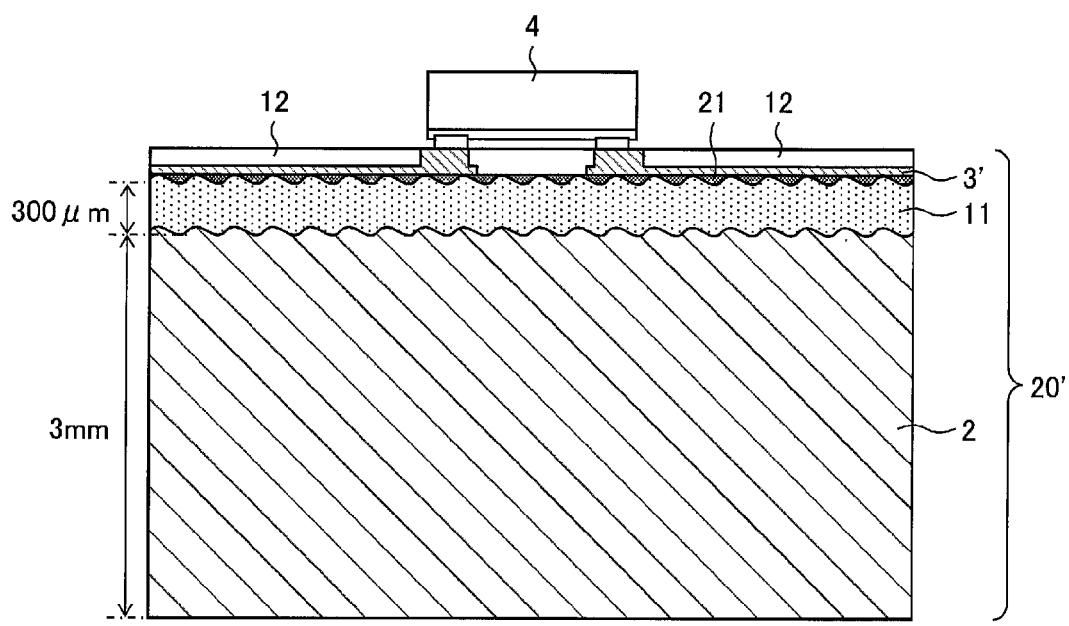
FIG. 10 is a diagram schematically showing a cut-out surface of a light emitting device including a substrate 20' for a light emitting device.

FIG. 10 is a diagram schematically showing a cut-out surface of a light emitting device obtained by mounting flip-chip type LED chips 4 on the substrate 20' for a light emitting device.

As shown in the drawing, the substrate 20' for a light emitting device is different from the substrate 20 for a light emitting device shown in FIG. 2, in that copper paste is used in the formation of a wiring pattern 3' containing electrode terminal portions and a thermal-sprayed alumina layer (first insulating layer 11) is coated with the smoothening layer 21 formed of an alumina-containing glass layer.

The surface of the alumina layer (first insulating layer 11) formed by thermal spraying is formed to have a convex and concave shape, and the convex and concave portions of the surface of the alumina layer (first insulating layer 11) are embedded for flattening by coating the surface of the alumina layer (first insulating layer 11) having such a convex and concave shape with the smoothening layer 21 formed of an alumina-containing glass layer.

By performing flattening of a base surface for forming metal paste as described above, the printing of metal paste (copper paste in this embodiment) is stably performed with excellent precision.

In this embodiment, a case where the entire portion of the wiring pattern 3' containing electrode terminal portions for mounting light emitting elements is formed with copper paste which is metal paste is described, but the wiring pattern may be formed using both of metal paste and plating.

Modified Example of Embodiment 5

Figure 17:
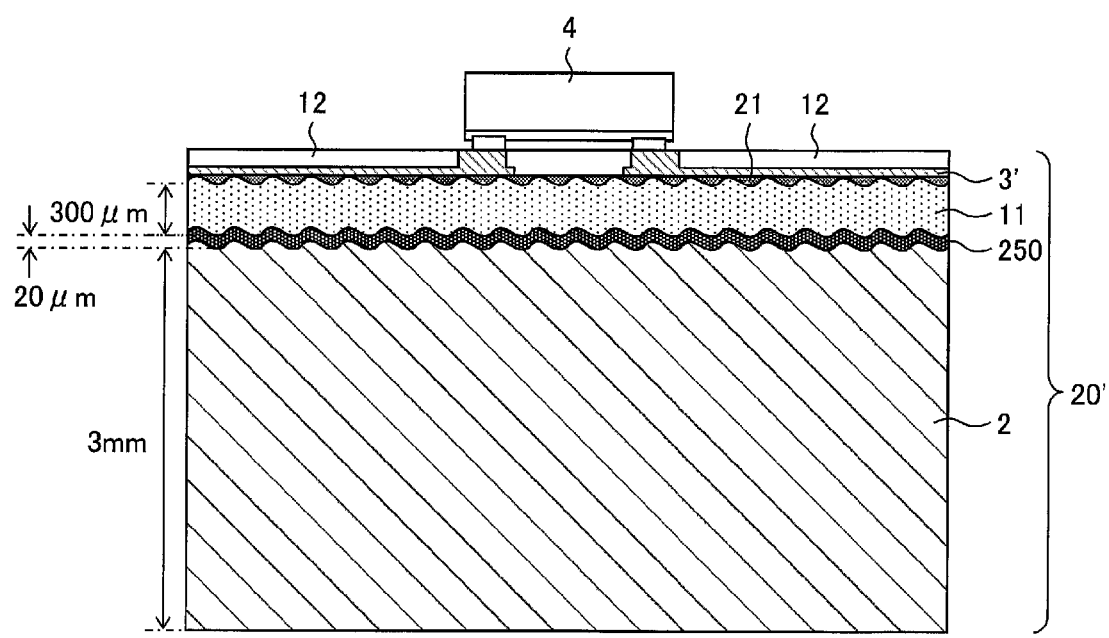
FIG. 17 is a diagram schematically showing a cut-out surface of a modified example of the light emitting device shown in FIG. 10.

A modified example of Embodiment 5 of the invention will be described as follows with reference to FIG. 17. FIG. 17 is a diagram for illustrating a modified example of the substrate 20' for a light emitting device of Embodiment 5.

This modified example is different from Embodiment 5 in that the buffer layer 250 is formed between the metal base 2 and the first insulating layer 11 in this modification example, as shown in FIG. 17. In Embodiment 5, in a case where the first insulating layer 11 is formed on the base formed of metal such as an aluminum plate to form a substrate for a light emitting device, particularly, in a case where this is used as a high-output substrate for a light emitting device, the base formed of metal is repeatedly expanded and contracted due to effects of heat generating in the light emitting elements loaded on the substrate. Accordingly, the first insulating layer 11 formed on the base may be peeled off or have deteriorated dielectric strength voltage properties due to mechanical loads received due to a difference in a coefficient of linear expansion between the first insulating layer and the metal base. In addition, the light emitting elements loaded on the substrate may also have a decreased lifetime due to effects of heat history received due to a difference in a coefficient of linear expansion between the first insulating layer and the metal base. Therefore, in this modified example of Embodiment 5, the buffer layer 250 is formed between the metal base 2 and the first insulating layer 11 as shown in FIG. 17.

The metal base 2 is a substrate formed of a material having high thermal conductivity. The material of the metal base 2 is not particularly limited, as long as it is a material having high thermal conductivity, and a substrate formed of metal containing aluminum, copper, stainless steel, or iron as a material can be used, for example.

The buffer layer 250 is the same buffer layer described in modification examples 1 and 2 of Embodiment 1 and has been described in modification examples 1 and 2 of Embodiment 1, and thus the description thereof will be omitted herein.

Embodiment 6

In this embodiment, heat resistance of the substrate for a light emitting device was calculated and compared with comparative examples, in order to confirm the effects of the invention.

A calculation model is simplified in a range not losing original properties, in order to easily perform calculation of heat resistance of the substrate for a light emitting device.

FIG. 11 to FIG. 15 show schematic diagrams of each light emitting device used for calculation of heat resistance of the substrate for a light emitting device.

(Outline of Schematic Diagram)

FIG. 11(a) is a diagram schematically showing a cut-out surface of a light emitting device in which the LED chips 4 which are flip-chip type light emitting elements are mounted on the substrate 20 for a light emitting device shown in FIG. 2, a protective film formed of alumite is formed on a surface of the metal base 2 of the substrate 20 for a light emitting device opposing a surface where the LED chips 4 are formed, and the substrate 20 for a light emitting device is thermally connected to a heat sink through heat radiating grease.

The substrate for a light emitting device shown in FIG. 11(a) includes a thermal-sprayed alumina layer (first insulating layer) formed of alumina by thermal spraying and having a layer thickness of 300 μm, a thermal-sprayed electrode layer (wiring pattern) formed of copper formed by thermal spraying and having a layer thickness of 100 μm and a thermal-sprayed electrode layer (terminal portion) formed of copper formed by thermal spraying and having a layer thickness of 200 μm for mounting LED chips (light emitting elements), and a ceramic-containing glass-based reflection layer (second insulating layer having light reflectivity) having the maximum layer thickness of 200 μm for covering the thermal-sprayed alumina layer (first insulating layer) and the thermal-sprayed electrode layer (wiring pattern) and a layer thickness of 100 μm in the wiring pattern portion, on aluminum (metal base) having a thickness of 3 mm.

LED chips (light emitting elements) which are heat sources having a flat dimension of 1000 μm (length)×1000 μm (width) are included on the thermal-sprayed electrode layers (electrode portions).

Glass or a resin containing heat-resistivity ceramic is used as the ceramic-containing glass-based reflection layer (second insulating layer having light reflectivity), but glass or a resin has thermal conductivity which is lower than that of metal by two digits, and accordingly, the contribution to heat radiating is negligibly small.

A rear surface of aluminum (metal base) of the substrate for a light emitting device shown in FIG. 11(a) is covered with a protective film formed of alumite having a film thickness of 10 μm.

Since the LED chips (light emitting elements) mounted on the thermal-sprayed electrode layer (electrode portion) were flip-chip type light emitting elements, an active layer is provided on the lower side of the LED chips (light emitting elements) shown in FIG. 11(a), that is, the vicinity of the thermal-sprayed electrode layer (electrode portion), and accordingly, excellent heat radiating properties are obtained and an increase in temperature in the LED chips can be substantially negligible.

Originally, the thermal-sprayed electrode layer (electrode portion) is divided into positive and negative electrodes. For example, in a case of using the LED chips (light emitting elements) having a flat dimension of 1000 μm×1000 μm, it is suitable to disposed respective positive and negative terminal portions having a flat dimension of 1000 μm (length)×400 μm (width) for positive and negative electrodes of the light emitting elements, as a typical example of the thermal-sprayed electrode layer (electrode portion). At this time, a separating portion having a width of 200 μm is formed between the positive and negative terminal portions. As a result, the total flat dimension of all of the positive and negative terminal portions is 1000 μm (length)×800 μm (width).

With respect to this, herein, the calculation of heat resistance was simplified by ignoring the space between terminal portions. That is, the heat resistance was calculated in a case where heating elements having the same size as the LED chips (light emitting elements) are placed on the thermal-sprayed electrode layer (electrode portion) having the same flat dimension as that of the LED chips (light emitting elements). Herein, the flat dimension of the LED chips (light emitting elements) which is 1000 μm×1000 μm coincides with the flat dimension of the thermal-sprayed electrode layer (electrode portion) which is 1000 μm×1000 μm.

In the light emitting device shown in FIG. 11(a), the substrate for a light emitting device is further thermally connected to a heat sink through heat radiating grease (thickness of 50 μm). When air is present between the substrate for a light emitting device and the heat sink, air becomes an excellent heat insulating material and disturbs heat radiating, and accordingly, excellent heat radiating to the heat sink is realized by inserting heat radiating grease.

FIG. 13(a) is a diagram schematically showing a cut-out surface of a light emitting device in which flip-chip type LED chips (light emitting elements) are mounted on the substrate 20' for a light emitting device shown in FIG. 10.

The substrate for a light emitting device shown in FIG. 13(a) is different from the substrate for a light emitting device shown in FIG. 11(a), in that copper metal paste is used in the formation of the terminal portions and the wiring pattern (formation of the electrode layer) and the thermal-sprayed alumina layer (first insulating layer 11) is coated with an alumina-containing glass layer (smoothening layer).

The convex and concave portions formed on the surface of the thermal-sprayed alumina layer (first insulating layer) formed by thermal spraying are embedded for flattening, and accordingly, the printing of metal paste is stably performed with excellent precision. Herein, a case where all of the terminal portions for mounting the wiring pattern and the light emitting elements is formed with metal base is described, but the terminal portions may be formed using both of metal paste and plating.

A configuration (Comparative Example 1) shown in FIG. 12(a) is used as a comparative example of the configuration shown in FIG. 11(a), and corresponds to a case where the thermal-sprayed alumina layer (first insulating layer 11) formed by thermal spraying in the configuration shown in FIG. 11(a) is replaced with an alumina-containing glass layer. In the configuration shown in FIG. 12(a), copper metal paste is used in the formation of the electrode layer formed of the wiring pattern and the electrode portions.

FIG. 14(a) and FIG. 15(a) are diagrams schematically showing a cut-out surface of the light emitting device in which face-up type LED chips (light emitting elements) are mounted on the substrate for a light emitting device as a comparative example.

In the substrate for a light emitting device as Comparative Example 2 shown in FIG. 14(a), aluminum (metal base) having a thickness of 3 mm is covered with an insulator layer which also serves as a ceramic-containing glass-based reflection layer having a layer thickness of 300 μm.

In the insulator layer which also serves as the ceramic-containing glass-based reflection layer, in a case where zirconia having high light reflectivity is used as ceramic particles, thermal conductivity thereof is substantially low as 1 W/(m·° C.). Herein, although the description is omitted due to no effects to the calculation of heat resistance of the substrate, a wiring pattern is further formed on the insulator layer which also serves as the ceramic-containing glass-based reflection layer. The wiring pattern is electrically connected to the face-up type LED chips (light emitting elements) and the face-up type LED chips (light emitting elements) emit light by receiving power supplied from an external power through the wiring pattern. The rear surface of the aluminum (metal base) is covered with a protective film formed of alumite having a thickness of 10 μm.

The face-up type LED chips (light emitting elements) are mounted on the insulator layer which also serves as the ceramic-containing glass-based reflection layer, using die bond paste. A thickness of the die bond paste is extremely small as normally approximately 5 μm, but thermal conductivity thereof is generally extremely low as 0.2 W/(m·° C.), and thus, the thickness thereof can be negligible in the heat calculation in a case of using the face-up type LED chips (light emitting elements). Since active layers of the face-up type LED chips (light emitting elements) are positioned on the upper side of the face-up type LED chips (light emitting elements) shown in FIG. 14(a) and on a side separated from the substrate for a light emitting device, an increase in temperature of the active layers in the LED chips cannot be negligible.

Herein, a flat dimension of the face-up type LED chips (light emitting elements) is set as 1000 μm×1000 μm and a height of the active layer is set as 100 μm. In the face-up type LED chips (light emitting elements), the terminal portions of the electrode layer is provided on the immediately lower portion of the LED chips (light emitting elements) as shown in FIG. 11(a), for example, but the face-up type LED chips (light emitting elements) are not compulsorily formed on the electrodes (on the wiring pattern). Particularly, in a high-output lighting device and a high-intensity light emitting device, the face-up type LED chips (light emitting elements) and the wiring pattern are formed on the insulator layer which also serves as the ceramic-containing glass-based reflection layer, in many cases, in order to ensure dielectric strength voltage properties or ensure high reflectivity. FIG. 14(a) is the example thereof. In the same manner as in FIG. 11(a), the substrate for a light emitting device is thermally connected to a heat sink through heat radiating grease.

In the substrate for a light emitting device as Comparative Example 3 shown in FIG. 15(a), heat radiating properties are improved by dividing the insulator layer which also serves as the ceramic-containing glass-based reflection layer of Comparative Example 2 shown in FIG. 14(a) into two layers. An insulating layer having high heat radiating properties is realized while maintaining high heat resistivity, by using a ceramic-containing glass-based reflection layer having high light reflectivity (low thermal conductivity) as an upper layer and using a ceramic-containing glass-based thermal conductive layer having high thermal conductivity (low thermal conductivity remodeled product) as a lower layer.

In this embodiment, a calculation model is simplified in a range not losing original properties, in order to easily perform calculation of heat resistance of the substrate for a light emitting device.

First, the electrode separation in the light emitting element mounting portions is simplified, that is, heat resistance is calculated by assuming the pattern as an integrated pattern, without considering division of the pattern into positive and negative electrodes. Such simplification is performed with the configurations shown in FIG. 11(a), FIG. 12(a), and FIG. 13(a).

In the configuration shown in FIG. 11(a), convex and concave portions of aluminum (metal base) formed by blasting or convex and concave portions of thermal-sprayed alumina layer (first insulating layer 11) is simplified as a flattened surface.

In the configuration shown in FIG. 13(a), the convex and concave portions of aluminum (metal base) formed by blasting is simplified as a flattened surface, and also, regarding a portion of the convex and concave portions of the surface of thermal-sprayed alumina layer (first insulating layer) smoothened by using an alumina-containing glass layer (smoothening layer), interfaces between the thermal-sprayed alumina layer (first insulating layer) and the alumina-containing glass layer (smoothening layer) are simplified as flattened surfaces. The calculation is performed by simplifying all of convex and concave portions by ignoring the effects of the convex and concave shape and considering effects to low thermal conductivity of the alumina-containing glass layer (smoothening layer).

(Calculation of Heat Resistance Corresponding to Schematic Diagram)

FIG. 11(b) to FIG. 15(b) respectively show thermal conductivity $\sigma$th (W/(m·° C.)) for each layer and a layer thickness d (mm) used for calculating heat resistance of the substrate for a light emitting device having a layer structure shown in the schematic diagrams of FIG. 11(a) to FIG. 15(a).

FIG. 11(b) to FIG. 15(b) also show heat resistance Rth (° C./W) for each layer and an increase in temperature $\Delta$T (° C.) acquired by the calculation, in the same manner as described above.

Each of the heat resistance Rth (° C./W) for each layer is added to obtain a subtotal and the heat resistance of the substrate for a light emitting device is acquired. Meanwhile, the heat resistance of the entire light emitting device is shown in a portion of the total.

In FIG. 14(b) and FIG. 15(b), since the face-up type LED chips (light emitting elements) are used, the calculation of an increase in temperature in the light emitting elements is also included in the calculation of the heat resistance of the entire light emitting device. Meanwhile, in FIG. 11(b) to FIG. 13(b), since the face-up type LED chips (light emitting elements) are used, the active layer is in the vicinity of the substrate for a light emitting deice and an increase in temperature in the LED chips was omitted as a negligible matter.

In the calculation of heat resistance of the substrate for a light emitting device acquired herein, heat resistance for one light emitting element is acquired by considering only heat generation in a light emitting element having a dimension of 1000 μm×1000 μm. A calculation result of the increase in temperature $\Delta$T is acquired by assuming that 0.75 W which is 50% of the supplied power is lost as heat, when the supplied power for one light emitting element is 1.5 W.

Hereinafter, calculation results and calculation conditions of heat resistance of the substrate for a light emitting device will be described.

(Calculation Conditions)

A value of the heat resistance of the substrate for a light emitting device depends on the position or the dimension of the heat source, but in results of the heat resistance Rth (° C./W) shown in FIG. 11(b), FIG. 12(b), FIG. 13(b), FIG. 14(b), and FIG. 15(b), the heat resistance Rth (° C./W) of each layer is calculated by assuming the active layer of the light emitting element as the only heat source. In FIG. 11(b), FIG. 12(b), FIG. 13(b), FIG. 14(b), and FIG. 15(b), not only the heat resistance Rth (° C./W) of each layer, but also the increase in temperature $\Delta$T (° C.) of each layer is acquired, and the increase in temperature $\Delta$T (° C.) is a value in a case where a calorific value of the heat source is 0.75 W.

In the calculation of the heat resistance Rth (° C./W) of each layer, spread of heat in a horizontal direction is considered. Specifically, as shown in FIG. 11(a), FIG. 12(a), FIG. 13(a), FIG. 14(a), and FIG. 15(a) with a broken line, the calculation is performed by assuming that heat uniformly diffused in a direction, the right and left sides of which are tilted by 45° C. with respect to a vertical direction of the substrate for a light emitting device.

Since the vicinity of the terminal portions of the electrode layer is covered with a ceramic-containing glass-based reflection layer having low thermal conductivity and the thermal conductivity of the terminal portions of the electrode layer is higher than that of the vicinity thereof by 1 to 2 digits, herein, the calculation is performed by assuming that heat passes through only the terminal portions of the electrode layer, and regarding the spread of heat in the horizontal direction, it is enough when a layer below the electrode pattern positioning the lower portion thereof is considered.

Based on such assumption, the heat resistance Rth (° C./W) and the increase in temperature $\Delta$T (° C.) of each layer having different thermal conductivity $\sigma$th (W/(m·° C.)) and the layer thickness d (m). The heat resistance of each layer in a case where a square heat source having a size a(m) of one side is approximated by an equation of Rth (° C./W)=d/($\sigma$th·a·(a+2d)), and the increase in temperature $\Delta$T (° C.) of each layer is $\Delta$T (° C.)=Rth·Q. Herein, Q(W) is a calorific value of the heat source.

(Calculation Results)

The heat resistance Rth (° C./W) and the increase in temperature $\Delta$T (° C.) of each layer shown in FIG. 11(b) are calculated by the calculation method described above. These are also calculated by the same calculation method in FIG. 12(b), FIG. 13(b), FIG. 14(b), and FIG. 15(b).

In the calculation results of heat resistance of the substrate for a light emitting device, as shown in FIG. 11(b), FIG. 12(b), FIG. 13(b), FIG. 14(b), and FIG. 15(b), the heat resistance of the substrate for a light emitting device shown in the schematic diagram of FIG. 11(a) is approximately 11° C./W, the heat resistance of the substrate for a light emitting device shown in the schematic diagram of FIG. 12(a) is approximately 35° C./W, the heat resistance of the substrate for a light emitting device shown in the schematic diagram of FIG. 13(a) is approximately 22° C./W, the heat resistance of the substrate for a light emitting device shown in the schematic diagram of FIG. 14(a) is approximately 186° C./W, and the heat resistance of the substrate for a light emitting device shown in the schematic diagram of FIG. 15(a) is approximately 103° C./W.

Figure 11:
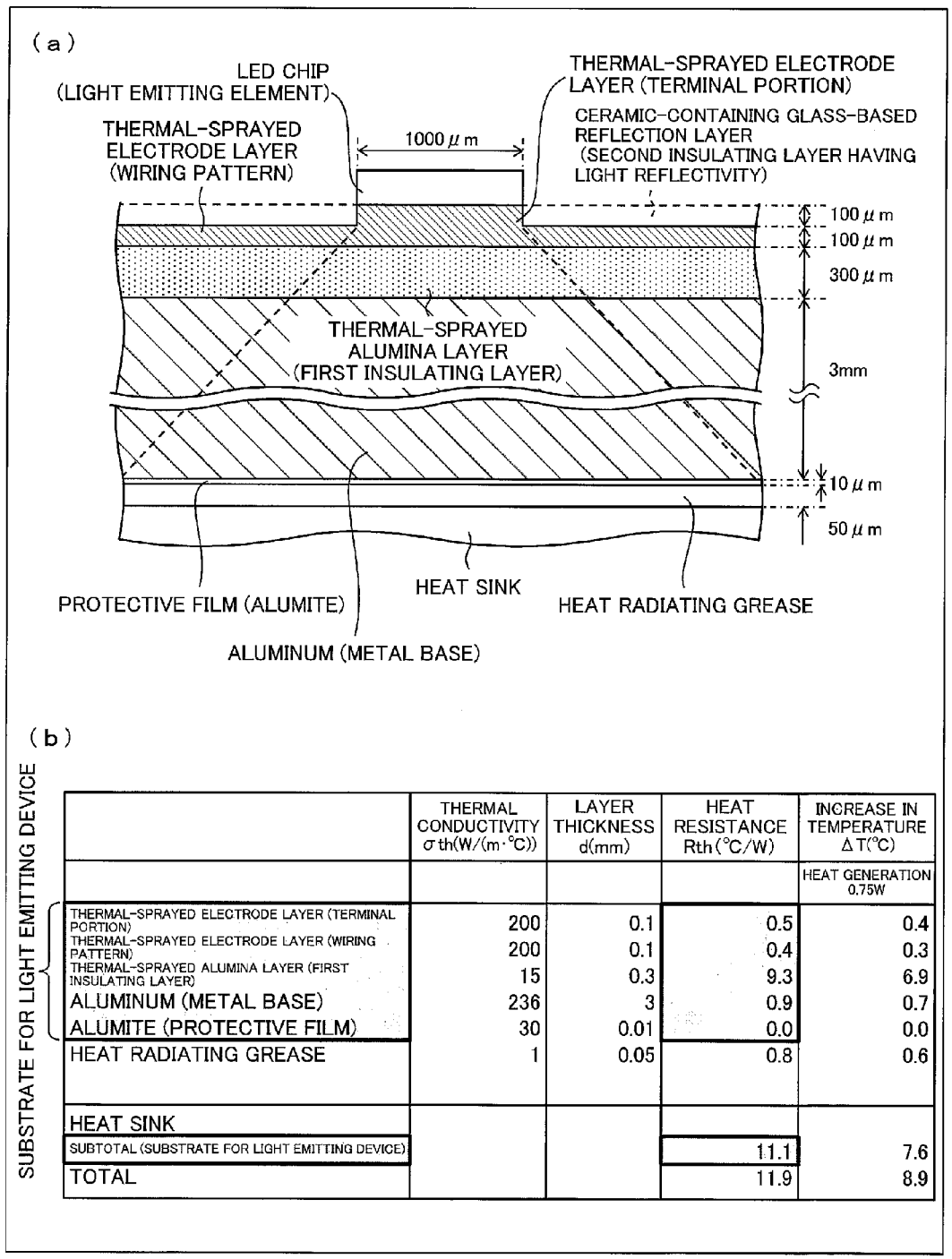
FIG. 11($a$) is a diagram schematically showing a cut-out surface of a light emitting device including the substrate 20 for a light emitting device shown in FIG. 2 and FIG. 11($b$) is a diagram showing calculation results of heat resistance of this light emitting device.
Figure 12:
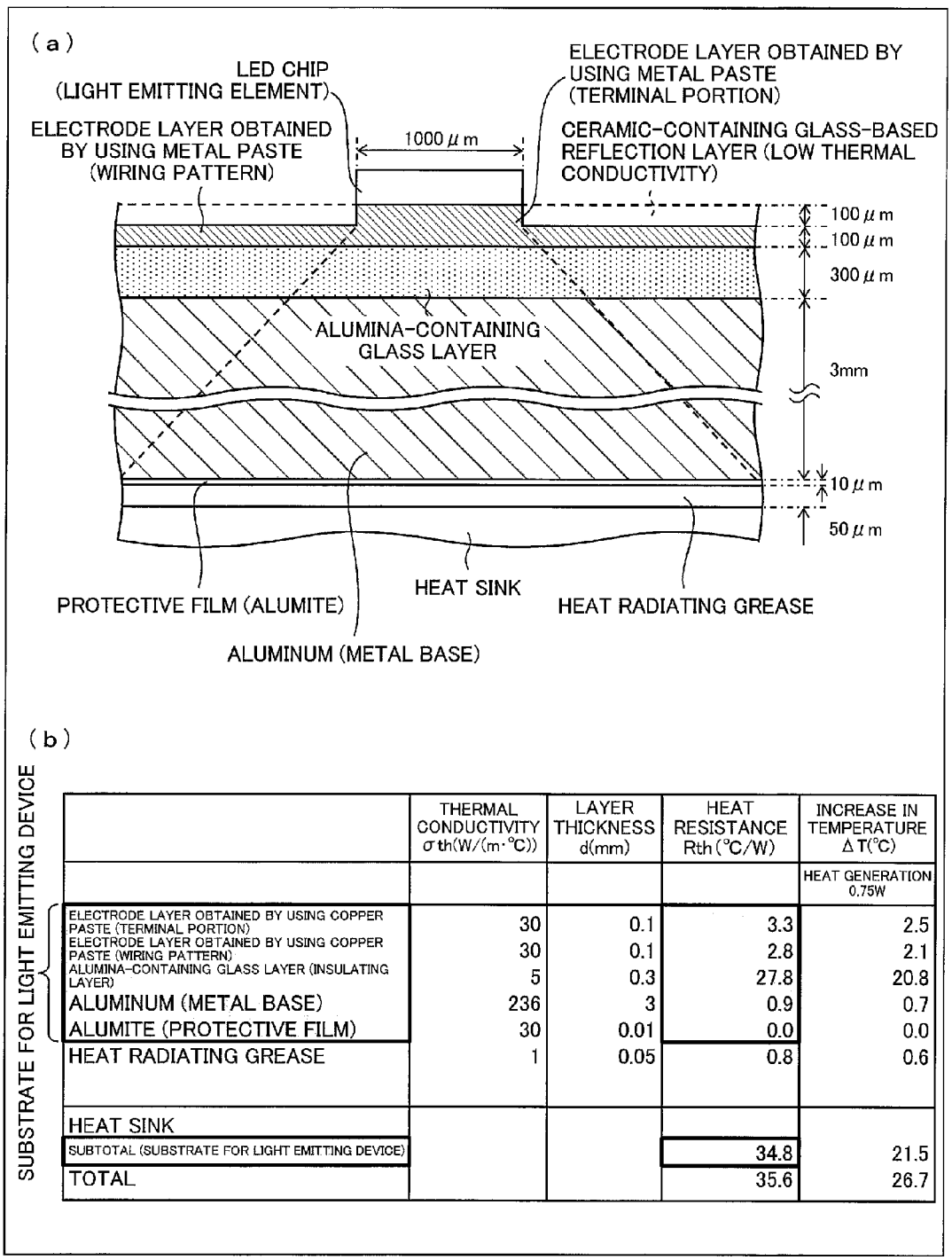
FIG. 12($a$) is a diagram schematically showing a cut-out surface of a light emitting device of Comparative Example 1 and FIG. 12($b$) is a diagram showing calculation results of heat resistance of this light emitting device.
Figure 13:
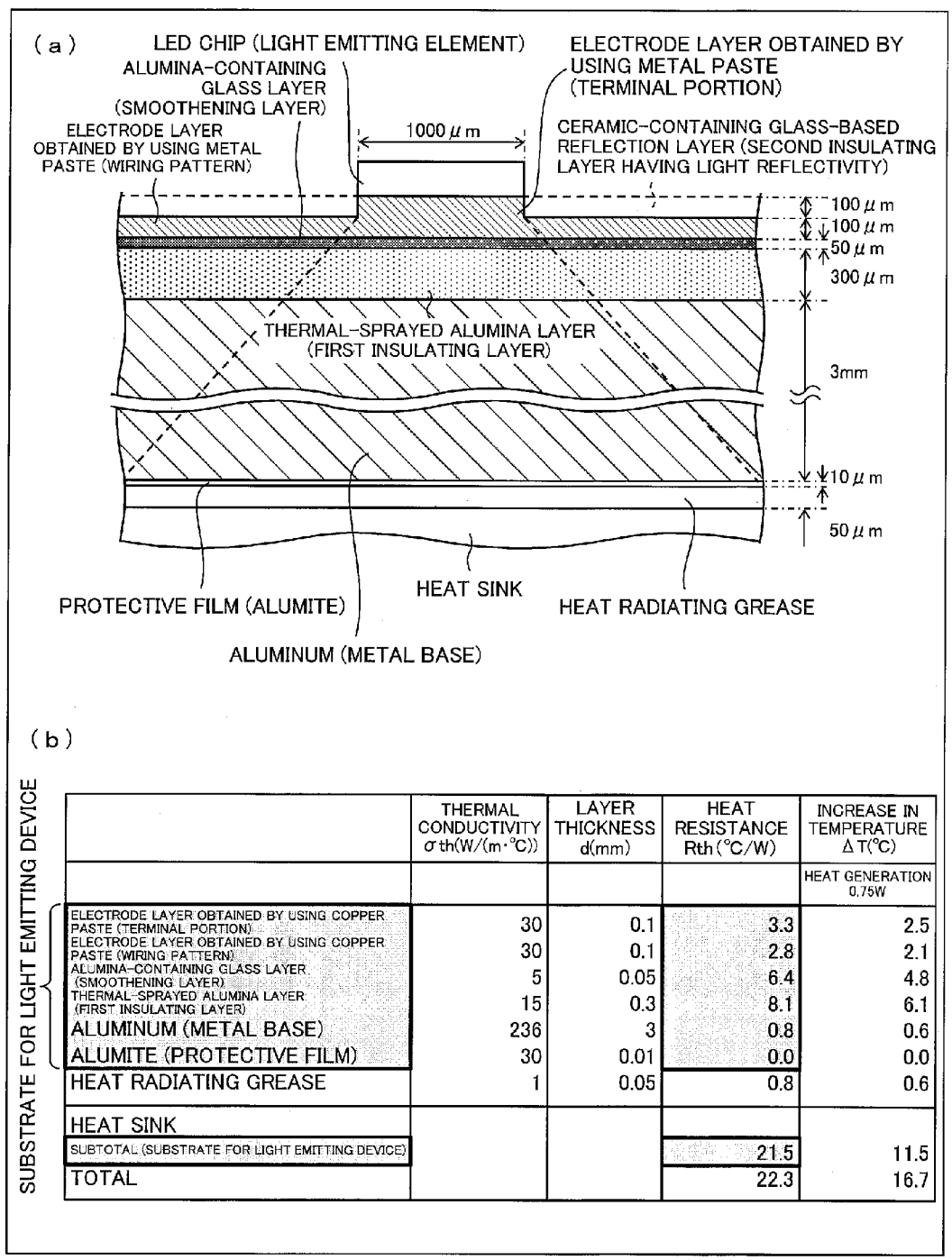
FIG. 13($a$) is a diagram schematically showing a cut-out surface of a light emitting device including the substrate 20' for a light emitting device shown in FIG. 10 and FIG. 13($b$) is a diagram showing calculation results of heat resistance of this light emitting device.
Figure 14:
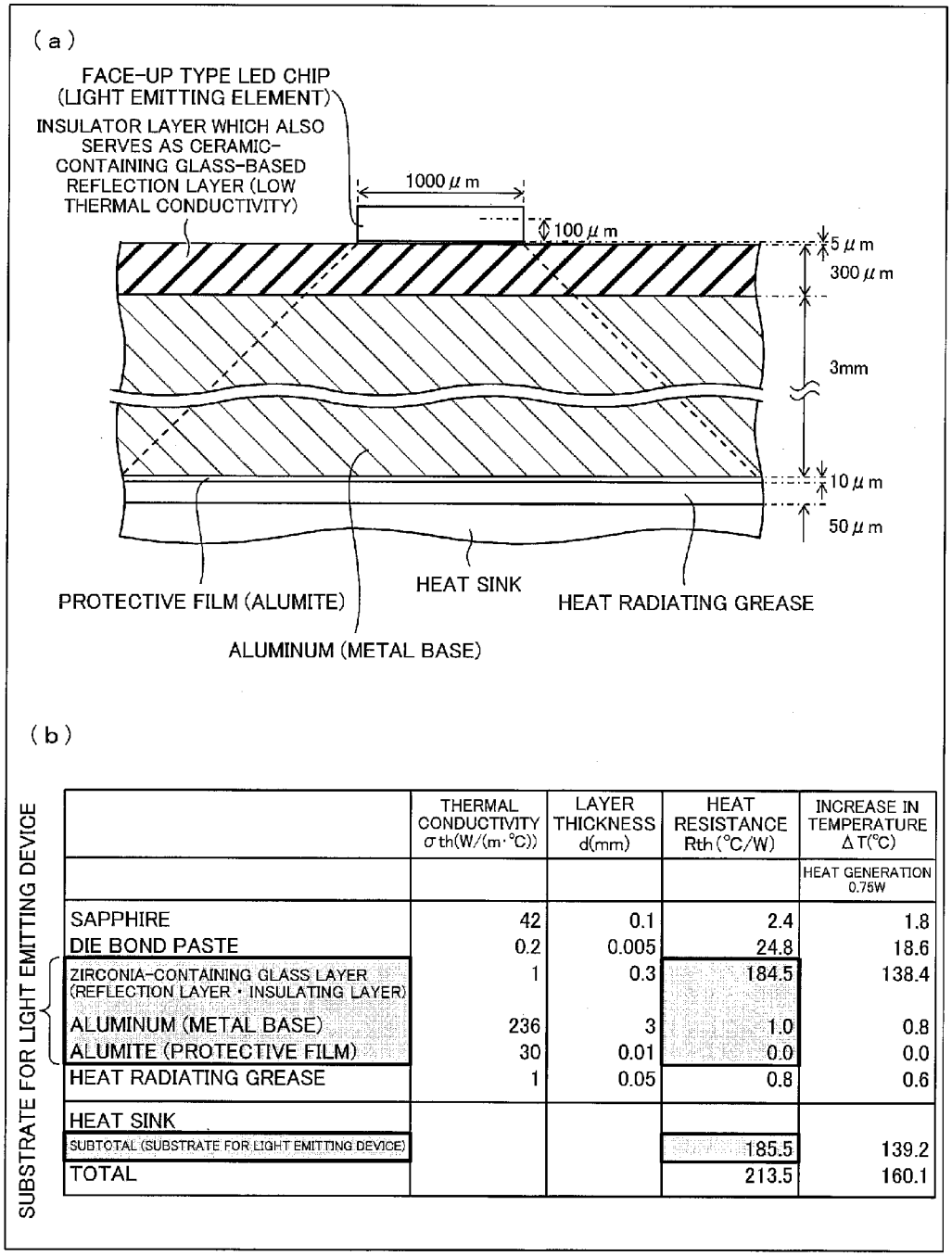
FIG. 14($a$) is a diagram schematically showing a cut-out surface of a light emitting device of Comparative Example 2 and FIG. 14($b$) is a diagram showing calculation results of heat resistance of this light emitting device.
Figure 15:
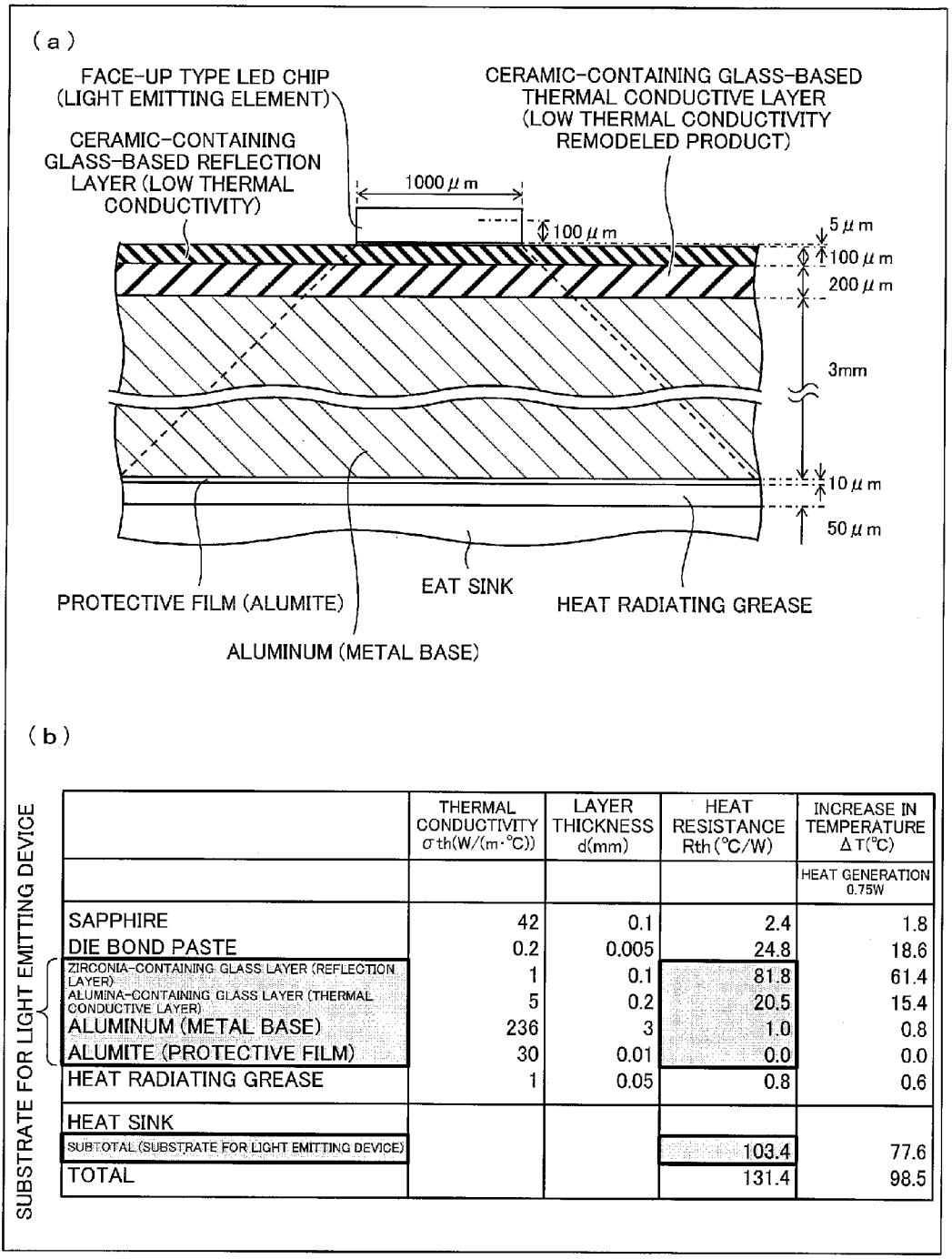
FIG. 15($a$) is a diagram schematically showing a cut-out surface of a light emitting device of Comparative Example 3 and FIG. 15($b$) is a diagram showing calculation results of heat resistance of this light emitting device.

From the results described above, in the five substrates for a light emitting device shown in FIG. 11(a) to FIG. 15(a), the heat resistance of the substrate for a light emitting device shown in FIG. 11(a) is the lowest and the heat resistance of the substrate for a light emitting device shown in FIG. 13(a) is the second lowest.

Accordingly, the heat radiating properties of the substrate for a light emitting device shown in FIG. 11(a) are most preferable and the heat radiating properties of the substrate for a light emitting device shown in FIG. 13(a) are secondly preferable.

Next, a difference in thermal conductivity and a difference in layer thickness of the insulating layer or the electrode layer of the substrates for a light emitting device shown in FIG. 11(a) to FIG. 15 (a).

The light emitting devices including the substrates for a light emitting device shown in FIG. 11(a) and FIG. 13(a) for confirming the effects of the invention and the light emitting devices including the substrates for a light emitting device shown in FIG. 12(a), FIG. 14(a), and FIG. 15(a) as Comparative Examples 1 to 3 are compared to each other, by setting the thickness of the insulating layer up to the part of the electrode layer or the thickness of the electrical insulating layer up to the part of the LED chips (light emitting element) to be 300 μm.

The heat resistance of the substrates for a light emitting device were compared to each other, by setting a dielectric strength voltage of the thermal-sprayed alumina layer (first insulating layer) or the ceramic-containing glass layer (specifically, an alumina-containing glass layer, an insulator layer which also serves as the ceramic-containing glass-based reflection layer, a ceramic-containing glass-based reflection layer+ceramic-containing glass-based thermal conductive layer) as 15 kV/mm and setting the thickness of the insulating layer as 300 μm, because it is a thickness so as to realize high dielectric strength voltage properties as 4.5 kV.

In the substrate for a light emitting device shown in FIG. 14(a), the entire insulating layer having a thickness of 300 μm becomes a reflection layer. This reflection layer is a zirconia-containing glass-based insulating layer formed by sintering sol-gel glass containing zirconia as a ceramic material, and thermal conductivity σth of the reflection layer is 1 W/(m·° C.).

Meanwhile, the insulating layer of the substrate for a light emitting device shown in FIG. 15(a) has a laminated structure of a reflection layer having low thermal conductivity and a thermal conductive layer. Among these two layers, the reflection layer disposed on the surface has a thickness of 100 μm and is a zirconia-containing glass-based insulating layer, and the thermal conductive layer is an alumina-containing glass-based insulating layer having a thickness of 200 μm and having higher thermal conductivity than that of the reflection layer. The thermal conductive layer is formed by sintering sol-gel glass in a state where alumina is contained. The thermal conductivity σth of the thermal conductive layer described above is 5 W/(m·° C.).

The insulating layer (first insulating layer) of the substrate for a light emitting device shown in FIG. 11(a) is a thermal-sprayed alumina layer (ceramic layer) formed by high velocity flame spraying (HVOF) or plasma spraying. This insulating layer (first insulating layer) is formed on the lower portion of the thermal-sprayed electrode layer formed of the wiring pattern and the terminal portions to have a thickness of 300 μm. The thermal conductivity σth of the insulating layer (first insulating layer) is 15 W/(m·° C.). The ceramic-containing glass-based reflection layer (second insulating layer having light reflectivity) is formed so as to cover the insulating layer (first insulating layer) and the wiring pattern and is shown in FIG. 11(a) with a broken line. The thermal conductivity of the ceramic-containing glass-based reflection layer (second insulating layer having light reflectivity) is the same as the thermal conductivity of the reflection layer of the substrate for a light emitting device shown in FIG. 14(a) and FIG. 15(a) and the thermal conductivity σth thereof is 1 W/(m·° C.). Although the thermal conductivity is low, from FIG. 11(a), FIG. 12(a), and FIG. 13(a), the second insulating layer having light reflectivity is not contained in a main heat radiating path, and accordingly, the effects applied to the heat resistance are negligible.

Both of the thermal-sprayed alumina layer which is the insulating layer (first insulating layer) of the substrate for a light emitting device shown in FIG. 11(a) and the alumina-containing glass which is the ceramic-containing glass-based thermal conductive layer of the substrate for a light emitting device shown in FIG. 15(a) contain alumina as a material, but the ceramic-containing glass-based thermal conductive layer shown in FIG. 15(a) receives effects of glass having low thermal conductivity, because glass is used as a binder. Accordingly, it is thought that the thermal conductivity σth of the thermal conductive layer is a low value as 5 W/(m·° C.).

With respect to this, the insulating layer (first insulating layer) is formed in the substrate for a light emitting device shown in FIG. 11(a) by thermal spraying. Alumina is heated in a fused state or a state close to that state for performing rapid collision formation with respect to the aluminum (metal base), and accordingly, alumina as ceramic is accumulated as it is in the insulating layer (first insulating layer). Thus, it is thought that the thermal conductivity σth of the insulating layer (first insulating layer) is a high value as 15 W/(m·° C.).

The electrode layer formed of the wiring pattern and the electrode portions is formed by further scraping a material obtained by laminating copper conductive layer by high velocity flame spraying (HVOF) or plasma spraying, by using chemical etching or dry etching. In the electrode layer, the thickness of the wiring pattern is 100 μm, the thickness of the protruded electrode portions formed for mounting the LED chips (light emitting elements) is 200 μm, and the thermal conductivity σth of both of them is 200 W/(m·° C.).

Thermal conductivity of pure copper is approximately 400 W/(m·° C.), but the copper electrode layer formed by thermal spraying is partially oxidized at the time of formation, and thus, the thermal conductivity thereof is lower than that of pure copper. When a degree of oxidation is high, the thermal conductivity become slower than 200 W/(m·° C.), and when a degree of oxidation is low, thermal conductivity increases. In order to positively prevent oxidation, the electrode layer may be formed by a cold spray method which is one method of thermal spraying, and in this case, the thermal conductivity is high as 200 W/(m·° C.) and excellent heat radiating properties are obtained.

Although the copper electrode layer formed by thermal spraying as described above is degraded than pure copper, due to partial oxidation, it is possible to realize thermal conductivity of 100 W/(m·° C.) to 200 W/(m·° C.), for example and high thermal conductivity sufficiently exceeding the range described above.

In addition, the thermal conductivity of the copper electrode layer formed by using metal paste is substantially lower than the thermal conductivity of the copper electrode layer described above by 1 digit, and is thermal conductivity of merely approximately 10 W/(m·° C.) to 30 W/(m·° C.). The electrode layer formed by thermal spraying is formed of only metal, but the electrode layer formed by using metal paste is an electrode layer obtained by drying and firing accumulated metal fine particles using an organic material such as a resin as a binder, and accordingly, contact resistance in interfaces between fine particles is high and as a result, the thermal conductivity of the entire electrode layer is decreased.

The alumina-containing glass layer which is the insulating layer of the substrate for a light emitting device shown in FIG. 12(a) is an alumina-containing glass insulating layer having a thickness of 300 μm and having high thermal conductivity among ceramic-containing glass insulating layers.

This is formed by sintering sol-gel glass in a state where alumina particles are contained. The thermal conductivity σth of the alumina-containing glass layer is 5 W/(m·° C.). The alumina-containing glass layer is formed of the same material as that of the alumina-containing glass layer used for the thermal conductive layer of FIG. 15(a). As described above, it is thought that, since glass is used as a binder, the thermal conductivity of the alumina-containing glass layer shows a lower value than that of the alumina layer formed by thermal spraying due to effects of glass having low thermal conductivity.

In the substrate for a light emitting device shown in FIG. 12(a), the electrode layer formed of the wiring pattern and the terminal portion is a copper electrode layer formed by printing, drying, and sintering the metal paste. The thermal conductivity σth thereof is 30 W/(m·° C.). For simplifying a calculation model, the entire electrode layer is formed with metal paste herein, but in practice, an electrode layer having the surface covered with plating and having the metal paste as a base electrode pattern may be used. The heat resistance of the electrode layer in this case is determined depending on a plating material used and a laminated structure.

Regarding the thickness of the electrode layer, the thickness of the wiring pattern was set as 100 μm and the thickness of the protruded portion formed for mounting the LED chips (light emitting elements) was set as 200 μm, in accordance with the substrate for a light emitting device shown in FIG. 11(a).

In the same manner as in FIG. 11(a), the ceramic-containing glass-based reflection layer is formed so as to cover the alumina-containing glass layer which is an insulating layer and the wiring pattern, and is also shown in FIG. 12(a) with a broken line. A zirconia-containing glass-based insulator having the same material is used, and thermal conductivity σth thereof is 1 W/(m·° C.). In the same manner as in FIG. 11(a), this reflection layer is not contained in a main heat radiating path, and accordingly, the effects applied to the heat resistance are negligible.

A difference between the substrate for a light emitting device shown in FIG. 13(a) and the substrate for a light emitting device shown in FIG. 11(a) will be described. In the same manner as in FIG. 11(a), the insulating layer of the substrate for a light emitting device shown in FIG. 13(a) is a thermal-sprayed alumina layer (first insulating layer) formed by high velocity flame spraying (HVOF) or plasma spraying. The convex and concave portions formed on the surface of the thermal-sprayed alumina layer (first insulating layer) are coated with the alumina-containing glass layer (smoothening layer) to have a flattened surface, and the metal (copper) paste is printed thereon, dried, and sintered to form a copper electrode layer. The alumina-containing glass layer (smoothening layer) was formed by sintering sol-gel glass containing alumina particles. The thermal conductivity σth of the alumina-containing glass layer (smoothening layer) which is an insulating layer is 5 W/(m·° C.).

A function of the alumina-containing glass layer (smoothening layer) which is an insulating layer is to increase printing precision by flattening the surface for printing the metal paste. Accordingly, a flattened surface coated with a glass-based insulator layer sintered by only sol-gel glass without adding ceramic particles may be formed. In this case, the thermal conductivity thereof is decreased to approximately 1 W/(m·° C.). In addition, a glass-based insulator layer containing ceramic particles, other than alumina particles may be formed.

In the same manner as in FIG. 12(a), regarding the electrode layer shown in FIG. 13(a), the thickness of the wiring pattern was set as 100 μm and the thickness of the protruded portion formed for mounting the LED chips (light emitting elements) was set as 200 μm. Since the electrode layer is formed by using copper metal paste, in the same manner as described above, the thermal conductivity σth thereof is 30 W/(m·° C.). In the same manner as in FIG. 12(a), in practice, an electrode layer having the surface covered with plating and having the metal paste as a base electrode pattern may be used. Herein, the electrode layer was formed by using copper metal paste, in order to easily perform the calculation.

As described above, in order to flatten the convex and concave portions formed on the surface of the thermal-sprayed alumina layer (first insulating layer) obtained by performing thermal spraying and laminating alumina, the convex and concave surface described above is coated with alumina-containing glass layer (smoothening layer) which is an insulating layer, but interfaces of the thermal-sprayed alumina layer (first insulating layer) and the alumina-containing glass layer (smoothening layer) coated thereon are set as flat surfaces in the same manner as other interfaces, in order to easily perform the calculation of the heat resistance. The thickness of the alumina-containing glass layer (smoothening layer) is set to be constant as 50 μm. By performing simplification as described above, effects to the heat resistance in a case where the alumina-containing glass layer as a flattening layer having lower thermal conductivity than both layers (thermal conductivity σth of 5 W/(m·° C.)) is inserted between the thermal-sprayed alumina layer (first insulating layer 11) having thermal conductivity σth of 15 W/(m·° C.) which is formed by thermal spraying and the copper electrode layer having thermal conductivity σth of 30 W/(m·° C.) which is formed by using metal paste, was calculated.

The reflection layer and the like other than the layers described above are assumed to be completely the same as in FIG. 11(a) and FIG. 12(a).

In the calculation results of heat resistance of the substrates for a light emitting device obtained by performing calculation under the assumption described above, the heat resistance of the substrate for a light emitting device shown in the schematic diagram of FIG. 11(a) is approximately 11° C./W, the heat resistance of the substrate for a light emitting device shown in the schematic diagram of FIG. 12(a) is approximately 35° C./W, the heat resistance of the substrate for a light emitting device shown in the schematic diagram of FIG. 13(a) is approximately 22° C./W, the heat resistance of the substrate for a light emitting device shown in the schematic diagram of FIG. 14(a) is approximately 186° C./W, and the heat resistance of the substrate for a light emitting device shown in the schematic diagram of FIG. 15(a) is approximately 103° C./W, as described above.

According to the heat resistance of each layer of the substrates for a light emitting device shown in FIG. 11(b), FIG. 12(b), FIG. 13(b), FIG. 14(b), and FIG. 15(b), it is found that the main portions determining the heat resistance of each substrate for a light emitting device are the insulating layer and the electrode layer disposed between the light emitting element and the aluminum (metal base). The contribution from the aluminum (metal base) or alumite (protective film) does not reach 10% at most in FIG. 11(b), FIG. 12(b), and FIG. 13(b).

Additional Configuration

As shown in Embodiments 1 to 6, as advantages of using a dense high-quality ceramic layer on the metal base, long-term reliability is improved, in addition to heat radiating properties and dielectric strength voltage properties. A ceramic layer functions as a buffer layer for reducing a difference in coefficients of linear expansion between the light emitting element and the metal base, and lifetime of the flip-chip type light emitting elements can be improved.

More specifically, it is possible to prevent a decrease in lifetime of the light emitting elements by interposing a thick ceramic layer formed of alumina between the metal base and the light emitting element. Sapphire or aluminum nitride is used as a base substrate of a blue light emitting element and a green light emitting element, and silicone (Si) or the like is used as a base substrate of a red light emitting element, in many cases. When metal is compared with a sapphire substrate, aluminum nitride, and silicone, a difference in coefficients of linear expansion is great, loads are applied to flip-chip type light emitting elements mounted on the metal base, when expansion and contraction of the metal base occurring due to temperature history is transmitted thereto, and this is a main reason for a decrease in lifetime of the light emitting elements.

However, a difference in coefficients of linear expansion between the ceramic layer, and a sapphire substrate, aluminum nitride, and silicone which are base substrates of the light emitting elements is small, and particularly, in a case where an alumina layer is used as the ceramic layer, the coefficient of linear expansion thereof coincides with the coefficient of linear expansion of sapphire which is a base substrate of a blue light emitting element. Accordingly, when a dense high-quality ceramic layer formed by thermal spraying is disposed on the metal base, particularly, when a thick film is formed, the ceramic layer absorbs expansion and contraction of the metal base and loads of expansion and contraction caused by the metal base are not transmitted to the flip-chip type light emitting elements. As a result, a decrease in lifetime caused by external expansion and contraction does not occur in the light emitting elements and it is possible to ensure long-term reliability of the light emitting device. The thermal conductivity of the ceramic layer formed by thermal spraying is higher than the thermal conductivity of the ceramic layer formed by using a binder, and heat radiating properties are not decreased, even with a thick film is set for achieving the objects described above.

Summary

The substrate for a light emitting device of Embodiment 1 is a substrate for a light emitting device including a base formed of a metal material, and includes: a first insulating layer having thermal conductivity which is formed on a surface of one side of the base; a wiring pattern which is formed on the first insulating layer; and a second insulating layer having light reflectivity which is formed on the first insulating layer and on some parts of the wiring pattern, so that some parts of the wiring pattern are exposed, and the first insulating layer is a layer of ceramic formed by thermal spraying.

According to the configuration described above, it is possible to realize a substrate for a light emitting device having high reflectivity, high heat radiating properties, dielectric strength voltage properties, long-term reliability with heat resistance and light resistance, and excellent mass productivity.

In the substrate for a light emitting device of Embodiment 2, in addition to Embodiment 1, it is preferable that the wiring pattern is formed by patterning a metal conductive layer formed by thermal spraying.

According to the configuration described above, since the wiring pattern is formed by patterning a metal conductive layer formed by thermal spraying, excellent adhesiveness between the first insulating layer and the wiring pattern is obtained, and since a high-resistivity layer having low thermal conductivity is not interposed therebetween, it is possible to realize a substrate for a light emitting device having excellent heat radiating properties. Since the wiring pattern is finally scraped from the conductive layer using etching after forming the conductive layer, there are no formation defects of wiring pattern or a short circuit between electrode terminals in a light emitting element mounting portion in the wiring pattern.

In the substrate for a light emitting device of Embodiment 3, in addition to Embodiment 1 or 2, it is preferable that a third insulating layer as a flattening layer is formed between the first insulating layer and the wiring pattern.

According to the configuration described above, since the base surface is a flattened surface, even in a case where the wiring pattern is, for example, formed by using the metal paste or by using both of metal paste and plating, it is possible to stably form the wiring pattern with excellent precision.

In the substrate for a light emitting device of Embodiment 4, in addition to Embodiments 1 to 3, it is preferable that the second insulating layer is a layer formed of a mixture of at least one of a vitreous matter and a resin and ceramic.

According to the configuration described above, since the second insulating layer is a layer formed of a mixture of at least one of a vitreous matter and a resin and ceramic, it is possible to form the second insulating layer at a comparatively low temperature.

In the substrate for a light emitting device of Embodiment 5, in addition to Embodiments 1 to 4, it is preferable that thermal conductivity of the first insulating layer is higher than thermal conductivity of the second insulating layer. In addition, it is more preferable that light reflecting performance of the second insulating layer is higher than light reflecting performance of the first insulating layer.

According to the configuration described above, since the thermal conductivity of the first insulating layer formed on the base formed of a metal material is high, it is possible to realize a substrate for a light emitting device having excellent heat radiating properties.

In the substrate for a light emitting device of Embodiment 6, in addition to Embodiments 1 to 5, it is preferable that the base is formed of any metal material of aluminum and copper.

According to the configuration described above, since the base is formed aluminum or copper having comparatively high thermal conductivity, it is possible to realize a substrate for a light emitting device having excellent heat radiating properties.

In the substrate for a light emitting device of Embodiment 7, in addition to Embodiments 1 to 6, it is preferable that a protective layer is formed on at least some parts or the entire portion of a region of the base where the first insulating layer is not formed.

In a case where the base contains an aluminum material, the protective layer may be an aluminum anodic oxidation coating (alumite layer). In a case of using an aluminum anodic oxidation coating (alumite layer), as the protective layer, it is more preferable to perform sealing treatment with respect to this aluminum anodic oxidation coating (alumite layer).

According to the configuration described above, it is possible to realize a substrate for a light emitting device which can prevent damages on the base by using the protective layer in the post processing or after completing a product, and improve long-term reliability.

In the substrate for a light emitting device of Embodiment 8, in addition to Embodiments 1 to 7, it is preferable that the wiring pattern is formed of copper or silver.

According to the configuration described above, since copper or silver which has high thermal conductivity and electrical conduction properties and is comparatively easily formed, it is possible to realize a substrate for a light emitting device having excellent mass productivity.

In the substrate for a light emitting device of Embodiment 9, in addition to Embodiments 1 to 8, an adhesion layer may be formed between the base and the first insulating layer.

According to the configuration described above, since the adhesion layer is formed, it is possible to use a thin metal plate as the conductive layer and to omit a step of forming the conductive layer. In addition, the wiring pattern can be formed by scarping the conductive layer formed of the thin metal plate by using etching. When a flat plate is used as the thin metal plate, it is possible to omit a smoothening step of a metal conductive layer which is performed before the etching treatment in the formation of the wiring pattern. In addition, there are no formation defects of wiring pattern or a short circuit between electrode terminals in a light emitting element mounting portion in the wiring pattern. Since metal having high purity can be used as the thin metal plate, wiring pattern having high thermal conductivity and electrical conduction properties can be formed.

According to the configuration described above, since the first insulating layer is directly formed on the conductive layer, without inserting an adhesion layer between the conductive layer formed of the thin metal plate and the first insulating layer, excellent adhesiveness between the first insulating layer and the wiring pattern formed of the conductive layer is obtained, and a high-resistivity layer having low thermal conductivity is not interposed between the two layers, and thus, it is possible to realize a substrate for a light emitting device having excellent heat radiating properties.

In the substrate for a light emitting device of Embodiment 10, in addition to Embodiments 1 to 9, it is preferable that a thickness of the first insulating layer is set to be from 50 µm to 500 µm and a thickness of the second insulating layer is set to be from 10 µm to 500 µm.

According to the configuration described above, it is possible to realize a substrate for a light emitting device having high reflectivity, high heat radiating properties, dielectric strength voltage properties, long-term reliability with heat resistance and light resistance.

In the substrate for a light emitting device of Embodiment 11, in addition to Embodiments 1 to 10, the inner portion of the second insulating layer may be suitably configured with a plurality of layers.

According to the configuration described above, since a layer having high thermal conductivity can be disposed on a layer of the second insulating layer close to the first insulating layer and a layer having high heat resistance can be disposed on a layer on a side opposite thereto, it is possible to realize a substrate for a light emitting device having high reflectivity, high heat radiating properties, dielectric strength voltage properties, long-term reliability containing heat resistance and light resistance. The values of thermal conductivity and heat resistance herein are relatively compared to each other in the second insulating layer.

In the substrate for a light emitting device of Embodiment 12, in addition to Embodiments 1 to 11, the first insulating layer may be an insulating layer formed of alumina and the second insulating layer may be an insulating layer obtained by covering particulate ceramic containing at least one of zirconia, titanium oxide, alumina, and aluminum nitride with vitreous matters.

According to the configuration described above, it is possible to realize a substrate for a light emitting device having high reflectivity, high heat radiating properties, dielectric strength voltage properties, long-term reliability with heat resistance and light resistance, and excellent mass productivity.

In the substrate for a light emitting device of Embodiment 13, in addition to Embodiments 1 to 12, the first insulating layer may be an insulating layer formed of alumina, the second insulating layer may be formed of a resin containing at least one of zirconia, titanium oxide, alumina, and aluminum nitride as particulate ceramic, and the resin may be a silicone resin, an epoxy resin, or a fluorine resin.

According to the configuration described above, although vitreous matters of a silicone resin, an epoxy resin, or a fluorine resin are deteriorated, it is advantageous that a hardening temperature is low and a formation process is easily performed, from viewpoints of heat resistance and light resistance.

In the substrate for a light emitting device of Embodiment 14, in addition to Embodiments 1 to 13, a buffer layer formed of a material having a smaller coefficient of linear expansion than that of the base may be formed between the base and the first insulating layer.

In a case where the first insulating layer is formed on the base formed of metal such as an aluminum plate to form a substrate for a light emitting device, particularly, in a case where this is used as a high-output substrate for a light emitting device, the base formed of metal is repeatedly expanded and contracted due to effects of heat generating in the light emitting elements loaded on the substrate. Accordingly, the first insulating layer 11 formed on the base may be peeled off or have deteriorated dielectric strength voltage properties due to mechanical loads received due to a difference in a coefficient of linear expansion between the first insulating layer and the base. In addition, the light emitting elements loaded on the base may also have a decreased lifetime due to effects of heat history received due to a difference in a coefficient of linear expansion between the first insulating layer and the metal base. However, according to the configuration described above, since the buffer layer formed of a material having a smaller coefficient of linear expansion than that of the base is formed between the base and the first insulating layer, it is possible to significantly decrease transmission of mechanical loads to the light emitting elements due to thermal expansion and contraction of the base, and therefore, it is possible to increase a length of lifetime of the light emitting elements and the light emitting device and to improve reliability.

In addition, the buffer layer 250 formed of a material having a smaller coefficient of linear expansion than that of the base and having a greater coefficient of linear expansion than that of the first insulating layer may be formed.

A light emitting device of Embodiment 15 includes a light emitting element which is electrically connected to a terminal portion of the wiring pattern exposed from the second insulating layer of the substrate for a light emitting device of Embodiments 1 to 14, the wiring pattern is connected to an external wiring or an external device, and a frame portion formed of a resin having light reflectivity which is formed so as to surround a region in which the light emitting element of the substrate for a light emitting device is disposed, and a sealing resin which seals the region surrounded by the frame portion are formed. In addition, a phosphor may be contained in the sealing resin.

According to the configuration described above, it is possible to realize a light emitting device having high reflectivity, high heat radiating properties, dielectric strength voltage properties, long-term reliability with heat resistance and light resistance, and excellent mass productivity.

In the substrate for a light emitting device of Embodiment 16, in addition to Embodiment 15, the light emitting element may be electrically connected to a terminal part of the wiring pattern by flip chip bonding.

According to the configuration described above, it is possible to realize a light emitting device including flip-chip type light emitting elements.

A manufacturing method of a substrate for a light emitting device of Embodiment 17 including a base formed of a metal material, includes: a first step of forming a first insulating layer having thermal conductivity on a surface of one side of the base and forming a conductive layer on the first insulating layer; and a second step of forming a second insulating layer having light reflectivity on the first insulating layer and on some parts of the conductive layer, so that some parts of the conductive layer are exposed, and the first insulating layer of ceramic is formed by thermal spraying in the first step.

According to the configuration described above, it is possible to realize a manufacturing method of a substrate for a light emitting device having high reflectivity, high heat radiating properties, dielectric strength voltage properties, long-term reliability with heat resistance and light resistance, and excellent mass productivity.

In the first step of the manufacturing method of a substrate for a light emitting device of Embodiment 18, the first insulating layer may be formed as the ceramic by performing thermal spraying of alumina.

According to the manufacturing method described above, the first insulating layer formed of alumina having high insulating properties and thermal conductivity and good balance therebetween can be formed by thermal spraying.

In the second step of the manufacturing method of a substrate for a light emitting device of Embodiment 19, the second insulating layer covered with vitreous matters formed by performing sol-gel reaction of a glass raw material may be formed with particulate ceramic containing at least one of zirconia, titanium oxide, alumina, and aluminum nitride.

According to the manufacturing method, it is possible to form the second insulating layer at a comparatively low temperature by performing a sol-gel reaction.

In the second step of the manufacturing method of a substrate for a light emitting device of Embodiment 20, the second insulating layer covered with vitreous matters formed by fusing and hardening of the glass particles may be formed with particulate ceramic containing at least one of zirconia, titanium oxide, alumina, and aluminum nitride.

According to the manufacturing method described above, it is possible to form the second insulating layer having high reflectivity and insulating layer.

In the second step of the manufacturing method of a substrate for a light emitting device of Embodiment 21, the second insulating layer may be formed by forming a resin containing at least one of zirconia, titanium oxide, alumina, and aluminum nitride as particulate ceramic, and the resin may be a silicone resin, an epoxy resin, or a fluorine resin.

According to the manufacturing method described above, although vitreous matters of the second insulating layer is deteriorated from viewpoints of heat resistance and light resistance, a hardening temperature thereof is low, and accordingly, it is possible to comparatively easily form the second insulating layer.

In the first step of the manufacturing method of a substrate for a light emitting device of Embodiment 22, the conductive layer may be formed by performing thermal spraying of metal.

According to the manufacturing method described above, it is possible to form the conductive layer at a comparatively low temperature.

In the first step of the manufacturing method of a substrate for a light emitting device of Embodiment 23, it is preferable that a protective layer is formed on at least some parts or the entire portion of a region of the base where the first insulating layer is not formed.

In a case where the base contains an aluminum material, the protective layer may be an aluminum anodic oxidation coating (alumite layer). In a case of using an aluminum anodic oxidation coating (alumite layer), as the protective layer, it is more preferable to perform sealing treatment with respect to this aluminum anodic oxidation coating (alumite layer).

According to the protective layer formed by the manufacturing method described above, it is possible to prevent damages on the base in the post processing or after completing a product and to improve long-term reliability.

In the first step of the manufacturing method of a substrate for a light emitting device of Embodiment 24, the base and the first insulating layer may be bonded to each other by an adhesion layer.

According to the manufacturing method described above, since an adhesion layer is formed, it is possible to use a thin metal plate and to omit a step of forming the conductive layer.

In the second step of the manufacturing method of a substrate for a light emitting device of Embodiment 25, regarding a portion for exposing the conductive layer, the portions of the anode electrode (anode land) 7 and the cathode electrode (cathode land) 8 connected to an external wiring or an external device may be exposed, in addition to the terminal portions electrically connected to the light emitting elements.

In the second step of the manufacturing method of a substrate for a light emitting device of Embodiment 26, regarding a portion for exposing the conductive layer, the portions of anode electrode (anode land) 7 and the cathode electrode (cathode land) 8 and the portions of anode mark 9 and the cathode mark 10 may be exposed, in addition to the terminal portions electrically connected to the light emitting elements.

In the first step of the manufacturing method of a substrate for a light emitting device of Embodiment 27, it is preferable that the first step includes a step of forming the third insulating layer as a flattening layer between the first insulating layer and the conductive layer.

According to the method, even in a case of forming the conductive layer by using metal paste or both of metal paste and plating, for example, a base surface is a flattened surface, and therefore, it is possible to stably form the conductive layer with excellent precision.

The invention is not limited to the embodiments described above, various modifications can be performed within a range shown in claims, and embodiments obtained by suitably combining technical means disclosed in different embodiments are contained in the technical scope of the invention.

INDUSTRIAL APPLICABILITY

The invention can be suitably used in a substrate for a light emitting device, a light emitting device using this substrate for a light emitting device, and a manufacturing method of this substrate for a light emitting device.

REFERENCE SIGNS LIST

1 LIGHT EMITTING DEVICE
2 METAL BASE
3 WIRING PATTERN
3' WIRING PATTERN (COPPER PASTE)
4 LED CHIP (LIGHT EMITTING ELEMENT)
5 LIGHT-REFLECTING RESIN FRAME
6 PHOSPHOR-CONTAINING SEALING RESIN
7 ANODE ELECTRODE (ANODE LAND)
8 CATHODE ELECTRODE (CATHODE LAND)
9 ANODE MARK
10 CATHODE MARK
11 FIRST INSULATING LAYER HAVING THERMAL CONDUCTIVITY (PROTECTIVE LAYER)
12 SECOND INSULATING LAYER HAVING LIGHT REFLECTIVITY
13 RESIST
14 REAR SURFACE PROTECTIVE SHEET
15 RESIST
16 ADHESION LAYER
17 RESIST
18 RESIST
19 PROTECTIVE FILM (PROTECTIVE LAYER)
20 SUBSTRATE FOR A LIGHT EMITTING DEVICE
20' SUBSTRATE FOR A LIGHT EMITTING DEVICE
20a SUBSTRATE FOR A LIGHT EMITTING DEVICE
21 SMOOTHENING LAYER (THIRD INSULATING LAYER)
250 BUFFER LAYER

The invention claimed is:

1. A substrate for a light emitting device including a base formed of a metal material, the substrate comprising:
a first insulating layer having thermal conductivity which is formed on a surface of one side of the base, the first insulating layer being a ceramic layer formed by thermal spraying;
a wiring pattern which is formed directly on the first insulating layer, by patterning a metal conductive layer formed by thermal spraying; and
a second insulating layer having light reflectivity which is formed on the first insulating layer and on some parts of the wiring pattern such that some parts of the wiring pattern are exposed; wherein
a buffer layer formed of a material having a smaller coefficient of linear expansion than that of the base is formed between the base and the first insulating layer.

2. The substrate for a light emitting device according to claim 1,
wherein a protective layer is formed on at least some parts or an entire portion of a region of the base where the first insulating layer is not formed.

3. The substrate for a light emitting device according to claim 2,
wherein the protective layer is an aluminum anodic oxidation layer.

4. The substrate for a light emitting device according to claim 1, wherein:
a thermal conductivity of the first insulating layer is higher than a thermal conductivity of the second insulating layer; and
light reflecting performance of the second insulating layer is higher than light reflecting performance of the first insulating layer.

5. The substrate for a light emitting device according to claim 1,
wherein the wiring pattern is formed of copper or silver.

6. The substrate for a light emitting device according to claim 1,
wherein a thickness of the first insulating layer is set to be from 50 μm to 500 μm and a thickness of the second insulating layer is set to be from 10 μm to 500 μm.

7. The substrate for a light emitting device according to claim 1,
wherein the first insulating layer is an insulating layer formed of alumina, and the second insulating layer is an insulating layer obtained by covering particulate ceramic containing at least one of zirconia, titanium oxide, alumina, and aluminum nitride with a vitreous substance.

8. The substrate for a light emitting device according to claim 1,
wherein the first insulating layer is an insulating layer formed of alumina, and the second insulating layer is formed of a resin containing at least one of zirconia, titanium oxide, alumina, and aluminum nitride as particulate ceramic, the resin being a silicone resin, an epoxy resin, or a fluorine resin.

9. A light emitting device comprising:
a light emitting element which is electrically connected to a terminal portion of the wiring pattern exposed from the second insulating layer of the substrate for the light emitting device according to claim 1,
wherein the wiring pattern is connected to an external wiring or an external device, and
wherein the light emitting device includes
a frame portion formed of a resin having light reflectivity which is formed so as to surround a region of the substrate for the light emitting device where the light emitting element is disposed, and
a sealing resin which seals the region surrounded by the frame portion.

10. A substrate for a light emitting device including a base formed of a metal material, the substrate comprising:
a first insulating, layer having thermal conductivity which k formed on a surface of one side of the base, the first insulating layer being a ceramic layer formed by thermal spraying;
a wiring pattern which is formed directly on the first insulating layer, by patterning a metal conductive layer formed by thermal spraying; and
a second insulating layer having light reflectivity which is formed on the first insulating layer and on some parts of the wiring pattern such that some parts of the wiring pattern are exposed, wherein
an inner portion of the second insulating layer is configured with a plurality of layers; and
a layer having a higher thermal conductivity is provided as a layer of the second insulating layer which layer is provided on a side close to the first insulating layer, and a layer having a higher light reflectivity is provided as a layer of the second insulating layer which layer is provided on another side opposite to the side close to the first insulating layer.

11. The substrate for a light emitting device according to claim 10,
wherein a protective layer is formed on at least some parts or an entire portion of a region of the base where the first insulating layer is not formed.

12. The substrate for a light emitting device according to claim 11, wherein the protective layer is an aluminum anodic oxidation layer.

13. The substrate for a light emitting device according to claim 10, wherein:
a thermal conductivity of the first insulating layer is higher than a thermal conductivity of the second insulating layer; and
light reflecting performance of the second insulating layer is higher than light reflecting performance of the first insulating layer.

14. The substrate for a light emitting device according to claim 10,
wherein the wiring pattern is formed of copper or silver.

15. The substrate for a light emitting device according to claim 10,
wherein a thickness of the first insulating layer is set to be from 50 µm to 500 µm and a thickness of the second insulating layer is set to be from 10 µm to 500 µm.

16. The substrate for a light emitting device according to claim 10,
wherein the first insulating layer is an insulating layer formed of alumina, and the second insulating layer is an insulating layer obtained by covering particulate ceramic containing at least one of zirconia, titanium oxide, alumina, and aluminum nitride with a vitreous substance.

17. The substrate for a light emitting device according to claim 10,
wherein the first insulating layer is an insulating layer formed of alumina, and the second insulating layer is formed of a resin containing at least one of zirconia, titanium oxide, alumina, and aluminum nitride as particulate ceramic, the resin being a silicone resin, an epoxy resin, or a fluorine resin.

18. A light emitting device comprising:
a light emitting element which is electrically connected to a terminal portion of the wiring pattern exposed from the second insulating layer of the substrate for the light emitting device according to claim 10,
wherein the wiring pattern is connected to an external wiring or an external device, and
wherein the light emitting device includes
a frame portion formed of a resin having light reflectivity which is formed so as to surround a region of the substrate for the light emitting device where the light emitting element is disposed, and
a sealing resin which seals the region surrounded by the frame portion.

* * * * *